(12) United States Patent
Zhu et al.

(10) Patent No.: US 10,163,792 B2
(45) Date of Patent: Dec. 25, 2018

(54) SEMICONDUCTOR DEVICE HAVING AN AIRGAP DEFINED AT LEAST PARTIALLY BY A PROTECTIVE STRUCTURE

(71) Applicant: QUALCOMM Incorporated, San Diego, CA (US)

(72) Inventors: John Jianhong Zhu, San Diego, CA (US); Jeffrey Junhao Xu, San Diego, CA (US); Choh Fei Yeap, San Diego, CA (US); Stanley Seungchul Song, San Diego, CA (US); Kern Rim, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 156 days.

(21) Appl. No.: 14/444,104

(22) Filed: Jul. 28, 2014

(65) Prior Publication Data

US 2016/0027726 A1    Jan. 28, 2016

(51) Int. Cl.
| | | |
|---|---|---|
| *H01L 23/528* | (2006.01) | |
| *H01L 21/768* | (2006.01) | |
| *H01L 21/311* | (2006.01) | |
| *H01L 21/321* | (2006.01) | |
| *H01L 23/522* | (2006.01) | |
| *H01L 23/532* | (2006.01) | |

(52) U.S. Cl.
CPC .... *H01L 23/5283* (2013.01); *H01L 21/31111* (2013.01); *H01L 21/3212* (2013.01); *H01L 21/7682* (2013.01); *H01L 21/76831* (2013.01); *H01L 23/5222* (2013.01); *H01L 23/53295* (2013.01); *H01L 21/76807* (2013.01); *H01L 2924/0002* (2013.01)

(58) Field of Classification Search
CPC ............... H01L 23/5283; H01L 23/528; H01L 23/53238; H01L 23/5329; H01L 23/53266; H01L 21/76831; H01L 21/7682; H01L 21/76807
See application file for complete search history.

(56) References Cited

U.S. PATENT DOCUMENTS

| | | |
|---|---|---|
| 6,368,939 B1 | 4/2002 | Sasaki |
| 7,977,228 B2 | 7/2011 | Ramachandrarao |
| 8,034,693 B2 | 10/2011 | Shibata et al. |

(Continued)

FOREIGN PATENT DOCUMENTS

| | | |
|---|---|---|
| EP | 0872887 A2 | 10/1998 |
| EP | 1970950 A2 | 9/2008 |

OTHER PUBLICATIONS

International Search Report and Written Opinion for International Application No. PCT/US2015/040120, ISA/EPO, dated Oct. 6, 2015, 6 pages.

(Continued)

*Primary Examiner* — Stephen W Smoot
*Assistant Examiner* — Sun Mi Kim King
(74) *Attorney, Agent, or Firm* — Qualcomm Incorporated-Toler

(57) ABSTRACT

An apparatus includes a first interconnect and a first barrier structure. The first barrier structure is in contact with a dielectric material. The apparatus further includes a first protective structure in contact with the first barrier structure and an etch stop layer. An airgap is defined at least in part by the first protective structure and the etch stop layer.

30 Claims, 13 Drawing Sheets

(56) References Cited

U.S. PATENT DOCUMENTS

| | | |
|---|---|---|
| 8,304,906 B2 | 11/2012 | Huang et al. |
| 8,456,009 B2 | 6/2013 | Su et al. |
| 8,575,000 B2 | 11/2013 | Purayath et al. |
| 2002/0158337 A1* | 10/2002 | Babich ............... H01L 21/7681 257/758 |
| 2006/0006538 A1 | 1/2006 | Allman et al. |
| 2007/0246831 A1* | 10/2007 | Gabric ............... H01L 21/7682 257/758 |
| 2008/0153252 A1 | 6/2008 | Liu et al. |
| 2009/0093100 A1 | 4/2009 | Xia et al. |
| 2012/0126413 A1 | 5/2012 | Braeckelmann et al. |
| 2013/0292835 A1* | 11/2013 | King ............... H01L 21/02178 257/741 |
| 2014/0191401 A1* | 7/2014 | Fischer ............... H01L 21/7685 257/751 |

OTHER PUBLICATIONS

Martin J., et al., "Integration of SiCN as a Low k Etch Stop and Cu Passivation in a High Performance Cu/Low k Interconnect," Proceedings of the IEEE 2002 International Interconnect Technology Conference, 2002, pp. 42-44.

\* cited by examiner

SEMICONDUCTOR DEVICE HAVING AN AIRGAP DEFINED AT LEAST PARTIALLY BY A PROTECTIVE STRUCTURE

I. FIELD

The present disclosure is generally related to a semiconductor device having an airgap defined at least partially by a protective structure.

II. DESCRIPTION OF RELATED ART

Advances in technology have resulted in smaller apparatuses and more powerful computing devices. For example, there currently exist a variety of portable personal computing devices, including wireless computing devices, such as portable wireless telephones, personal digital assistants (PDAs), and paging devices that are small, lightweight, and easily carried by users. More specifically, portable wireless telephones, such as cellular telephones and internet protocol (IP) telephones, can communicate voice and data packets over wireless networks. Further, many such wireless telephones include other types of devices that are incorporated therein. For example, a wireless telephone can also include a digital still camera, a digital video camera, a digital recorder, and an audio file player. Also, such wireless telephones can process executable instructions, including software applications, such as a web browser application, that can be used to access the Internet. As such, these wireless telephones can include significant computing capabilities.

Portable personal computing devices, such as wireless computing devices, may include multiple semiconductor devices. As a semiconductor device of the portable personal computing devices becomes smaller and more powerful, a capacitance (e.g., a parasitic capacitance) between interconnects of the semiconductor device may increase. To prevent the capacitance from interfering with the functioning of the semiconductor device, the semiconductor device may have an airgap defined between interconnects of a same layer. An etch process may be used as part of a formation of the airgap between two interconnects. However, the etch process may be destructive to (i.e., damage) the interconnects. For example, the etch process may cause damage to a barrier structure (e.g., a barrier layer) or a conductive material of an interconnect.

III. SUMMARY

Techniques to form an airgap between multiple interconnects, where the airgap is defined at least in part by a protective structure coupled to one of the multiple interconnects are disclosed. The techniques include forming a trench in one or more layers of a semiconductor device, such as in one or more dielectric layers of the semiconductor device. A protective layer is formed (e.g., conformally deposited) in the trench prior to forming an interconnect in the trench. The protective layer may be in contact with a particular dielectric layer of the semiconductor device, such that the protective layer may protect the interconnect in the trench when the particular dielectric layer is etched. The interconnect may be formed in the trench such that the protective layer contacts an outer surface of the interconnect (e.g., a surface of a barrier layer of the interconnect).

After the interconnect is formed in the trench, an etch process may be performed to remove the particular dielectric layer. For example, the particular dielectric layer may be removed to establish a cavity between the interconnect (coupled to the protective layer) and another interconnect. The protective layer protects the interconnect from damage caused by the etch process used to remove the particular dielectric material. An etch stop layer may be deposited (e.g., non-conformally deposited) on the interconnect and the other interconnect to close an opening of the cavity to establish an airgap. The airgap may be defined by the protective layer (e.g., a protective structure) and one or more other structures or layers of the semiconductor device, such as one or more etch stop layers and/or another protective layer coupled to the other interconnect, as illustrative, non-limiting examples. By including the protective layer, the interconnect is protected during the etch process used to establish the cavity. As such, the semiconductor device may exhibit higher reliability as compared to semiconductor devices that do not include a protective layer.

In a particular embodiment, an apparatus includes a first interconnect. The first interconnect includes a first barrier structure. The first barrier structure is in contact with a dielectric material. The apparatus further includes a first protective structure in contact with the first barrier structure and an etch stop layer. An airgap is defined at least in part by the first protective structure and the etch stop layer.

In another particular embodiment, a method includes depositing a protective layer in a trench. The method further includes etching the protective layer to define a first protective structure on a sidewall of the trench. The method also includes etching a dielectric material to expose an etch stop layer. A cavity is defined at least in part by the first protective structure and the etch stop layer.

In another particular embodiment, an apparatus includes means for resisting diffusion of a conductive material of an interconnect into a dielectric layer of a semiconductor device. The means for resisting the diffusion is in contact with the dielectric layer. The apparatus further includes means for defining an airgap. The means for defining is in contact with the means for resisting.

In another particular embodiment, a non-transitory computer-readable medium includes processor-executable instruction. The processor executable instructions, when executed by a processor, cause the processor to initiate formation of a semiconductor device. Forming the semiconductor device includes depositing a protective layer in a trench. Forming the semiconductor device further includes etching the protective layer to define a first protective structure on a sidewall of the trench. Forming the semiconductor device also includes etching a dielectric material to expose an etch stop layer. A cavity is defined at least in part by the first protective structure and the etch stop layer.

One particular advantage provided by at least one of the disclosed embodiments is reduced capacitance between interconnects (due to the airgap between the interconnects) while protecting one or more of the interconnects from degradation during an etch process performed as part of formation of the airgap as compared to devices that do not include a protective structure.

Other aspects, advantages, and features of the present disclosure will become apparent after review of the entire application, including the following sections: Brief Description of the Drawings, Detailed Description, and the Claims.

IV. BRIEF DESCRIPTION OF THE DRAWINGS

V. DETAILED DESCRIPTION

Particular embodiments of the present disclosure are described below with reference to the drawings. In the description, common features are designated by common reference numbers.

Figure 1:
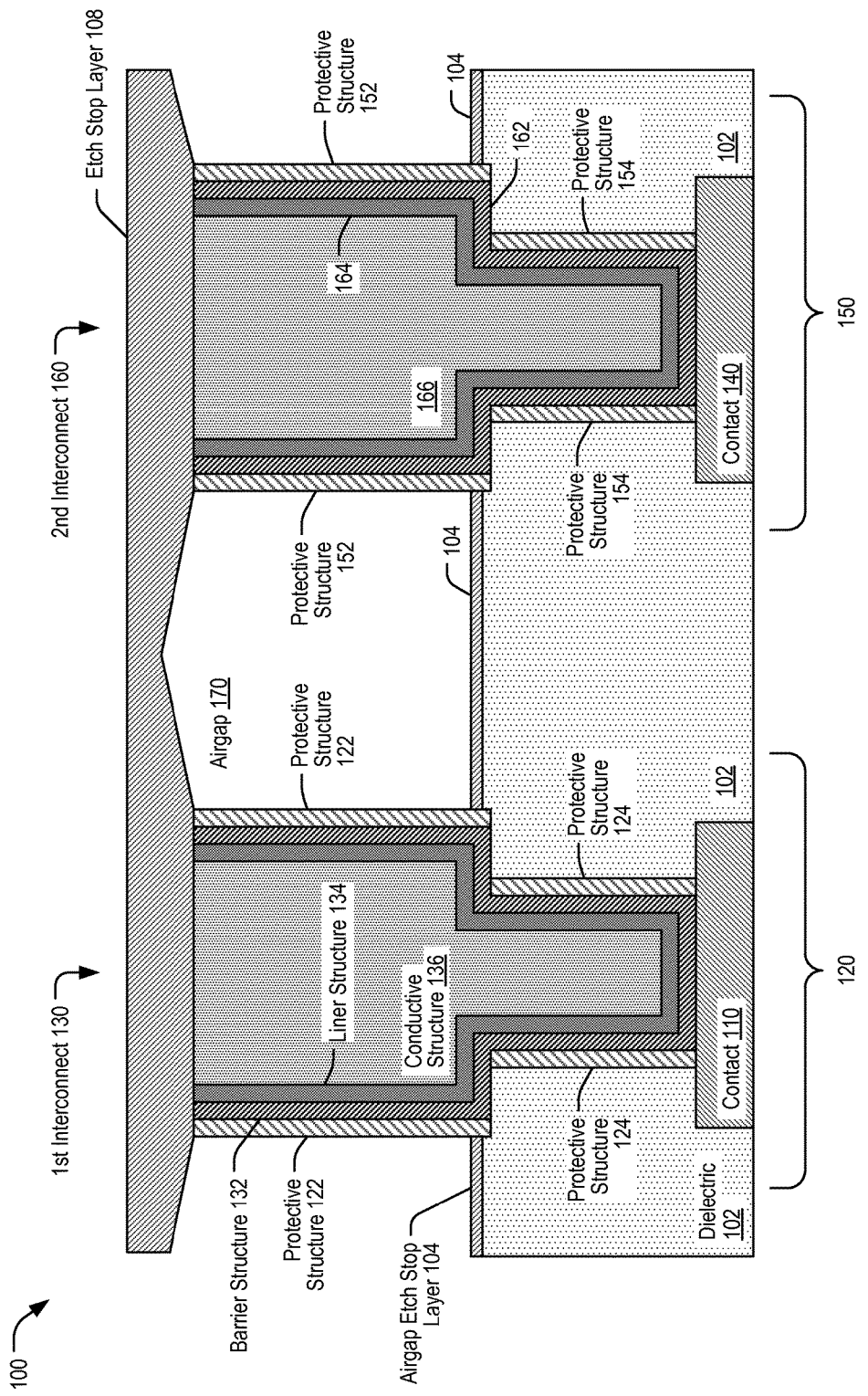
FIG. 1 is a diagram of a semiconductor device having an airgap defined at least partially by a protective structure.

Referring to FIG. 1, a diagram of a semiconductor device 100 having an airgap defined at least in part by a protective structure is shown. The semiconductor device 100 includes multiple layers and/or materials. For example, the semiconductor device 100 may include an etch stop layer 108, an airgap etch stop layer 104, and a dielectric material 102. The semiconductor device 100 may further include a first portion 120 (e.g., a first region) and a second portion 150 (e.g., a second region).

The semiconductor device 100 may include one or more conductive structures, such as one or more interconnects that electrically couple multiple devices of the semiconductor device 100, such as by routing power/signals to and from the multiple devices. For example, the first portion 120 of the semiconductor device 100 may include a first interconnect 130 that includes a conductive structure 136 (e.g., a conductive material), a liner structure 134 (e.g., a liner layer), and a barrier structure 132 (e.g., a barrier layer), as illustrative non-limiting examples. The liner structure 134 may be positioned between the barrier structure 132 and the conductive structure 136. In some embodiments, the first interconnect 130 may include additional structures/layers, such as one or more additional conductive structures, one or more additional liner structures, one or more additional barrier structures, one or more buffer structures, one or more spacer structures, or any combination thereof.

The second portion 150 of the semiconductor device 100 may include a second interconnect 160 that includes a second conductive structure 166, a second liner structure 164, and a second barrier structure 162. The first interconnect 130 may be coupled to a first contact 110 and the second interconnect 160 may be coupled to a second contact 140.

One or more protective structures may be coupled to the first interconnect 130. For example, a protective structure 122 and a protective structure 124 may be coupled to the first interconnect 130. To illustrate, the protective structures 122, 124 may be coupled to (e.g., touching) an outer structure, such as an outer layer, of the first interconnect 130. The outer structure of the first interconnect 130 may include the barrier structure 132. The protective structure 122 may be coupled to a first portion of the barrier structure 132 and the protective structure 124 may be coupled to a second portion of the barrier structure 132. The first portion and/or the second portion of the barrier structure 132 may correspond to or be associated with sidewall portions of the barrier structure 132. For example, the first portion may correspond to a surrounding sidewall of a line portion of the first interconnect 130, such as within a metal layer, and the second portion may correspond to a surrounding sidewall of a via portion of the first interconnect 130, such as within an interlayer dielectric.

One or more protective structures may be coupled to an outer structure (e.g., an outer layer) of the second interconnect 160. For example, the outer structure of the second interconnect 160 may include the second barrier structure 162. A protective structure 152 may be coupled to a first portion of the barrier structure 162 and a protective structure 154 may be coupled to a second portion of the second barrier structure 162.

The first barrier structure 132 and/or the second barrier structure 162 may be in contact with the dielectric material 102. For example, a particular portion of the first barrier structure 132 may be in contact with a horizontal surface of the dielectric material 102. The particular portion of the first barrier structure 132 may be located between the first portion of the first barrier structure 132 in contact with the protective structure 122 and the second portion the first barrier structure 132 in contact with protective structure 124. A particular portion of the second barrier structure 162 may be in contact with another horizontal surface of the dielectric material 102. The particular portion of the second barrier structure 162 may be located between the first portion of the second barrier structure 162 in contact with the protective structure 152 and the second portion of the second barrier structure 162 in contact with the protective structure 154.

The semiconductor device 100 may have an airgap 170 defined therein. For example, as illustrated in FIG. 1, the airgap 170 may be defined by one or more of the etch stop layer 108, the airgap etch stop layer 104 (e.g., an etch stop layer (ESL)), the first protective structure 122, and the protective structure 152. Additionally, the airgap 170 may be defined by one or more other structures or layers of the semiconductor device 100. For example, in some embodiments, the airgap 170 may be further defined by a second dielectric layer, one or more additional etch stop layers, one or more additional protective structures, etc. A capacitance between the first interconnect 130 and the second interconnect 160 (e.g., across the airgap) may be less than if a dielectric material, instead the airgap 170, were positioned between the first interconnect 130 and the second interconnect 160.

During operation of the semiconductor device 100, one or more electrical charges (e.g., charges provided in response to an alternating current (AC) voltage or a direct current (DC) voltage from a signal/power source) may be applied to the first interconnect 130, the second interconnect 160, or both. For example, a charge may be applied by a source, such as a signal/current source or a voltage source, at the first contact 110 and/or at the second contact 140. A charge applied to the first contact 110 may pass through the first interconnect 130 to another circuit coupled to the first interconnect 130. Likewise, a charge applied to the second contact 140 may pass through the second interconnect 160 to another circuit coupled to the second interconnect 160.

Although the semiconductor device 100 is depicted as having two interconnects (e.g. the first interconnect 130 and the second interconnect 160), in other embodiments the semiconductor device 100 may include more than two or less than two interconnects. Likewise, in some embodiments, the semiconductor device 100 may include multiple airgaps defined as described with reference to the airgap 170. Although not shown in FIG. 1, the semiconductor device 100 may include one or more additional layers and/or one or more additional structures. To illustrate, a seed layer (e.g., a seed structure) may be positioned between the liner structure 134 and the conductive structure 136, as an illustrative, non-limiting example. The seed layer and the conductive structure 136 may be the same material, such as a conductive material (e.g., copper).

In some embodiments, the first interconnect 130 may not include the first barrier structure 132 and/or the first liner structure 134. For example, in an embodiment where the first interconnect 130 does not include the first barrier structure 132, the first liner structure 134 may be the outer structure (of the first interconnect 130) that is in contact with the protective structure 122, with the dielectric material 102, and with the protective structure 124. As another example, in an embodiment where the first interconnect 130 does not include the barrier structure 132 and the liner structure 134, the first conductive structure 136 may be in contact with the dielectric material 102. Similarly, the second interconnect 160 may not include the second barrier structure 162 and/or the second liner structure 164. Alternatively or additionally, the first interconnect 130 and/or the second interconnect 160 may include one or more additional structures or layers. For example, the first interconnect 130 may include a buffer layer positioned between the first liner structure 134 and the first barrier structure 132. As another example, the buffer layer may be the outer structure of the first interconnect 130, such that the buffer layer is positioned between the protective structures 122, 124 and the first barrier structure 132. As another example, the first interconnect 130 may include one or more spacers located between the first barrier structure 132 and the protective structure 122 and/or between the first barrier structure 132 and the protective structure 124. Similarly, the second interconnect 160 may include one or more buffer layers, one or more spacers, or a combination thereof. In each embodiment, one or more protective structures may at least in part define an airgap. For example, one or more protective structures may constitute a boundary of the airgap (in one or more directions). To illustrate, the protective structure 122 may at least partially define (e.g., constitute a boundary of) the airgap 170. The airgap 170 may be further defined (e.g., bounded) by the protective structure 152, the etch stop layer 108, and the airgap etch stop layer 104.

By defining (e.g., establishing) the airgap 170 at least in part by the protective structure 122, the semiconductor device 100 may have a reduced capacitance between the first interconnect 130 and/or the second interconnect 160 as compared to semiconductor devices that do not include the airgap 170, such as semiconductor devices that have a dielectric material positioned between interconnects instead of an airgap. The protective structure 122 may protect the first interconnect 130 during the formation of the airgap 170, thereby increasing reliability of the first interconnect 130 and increasing a yield count associated with the semiconductor device as compared to semiconductor devices that do not include a protective structure.

Figure 2:
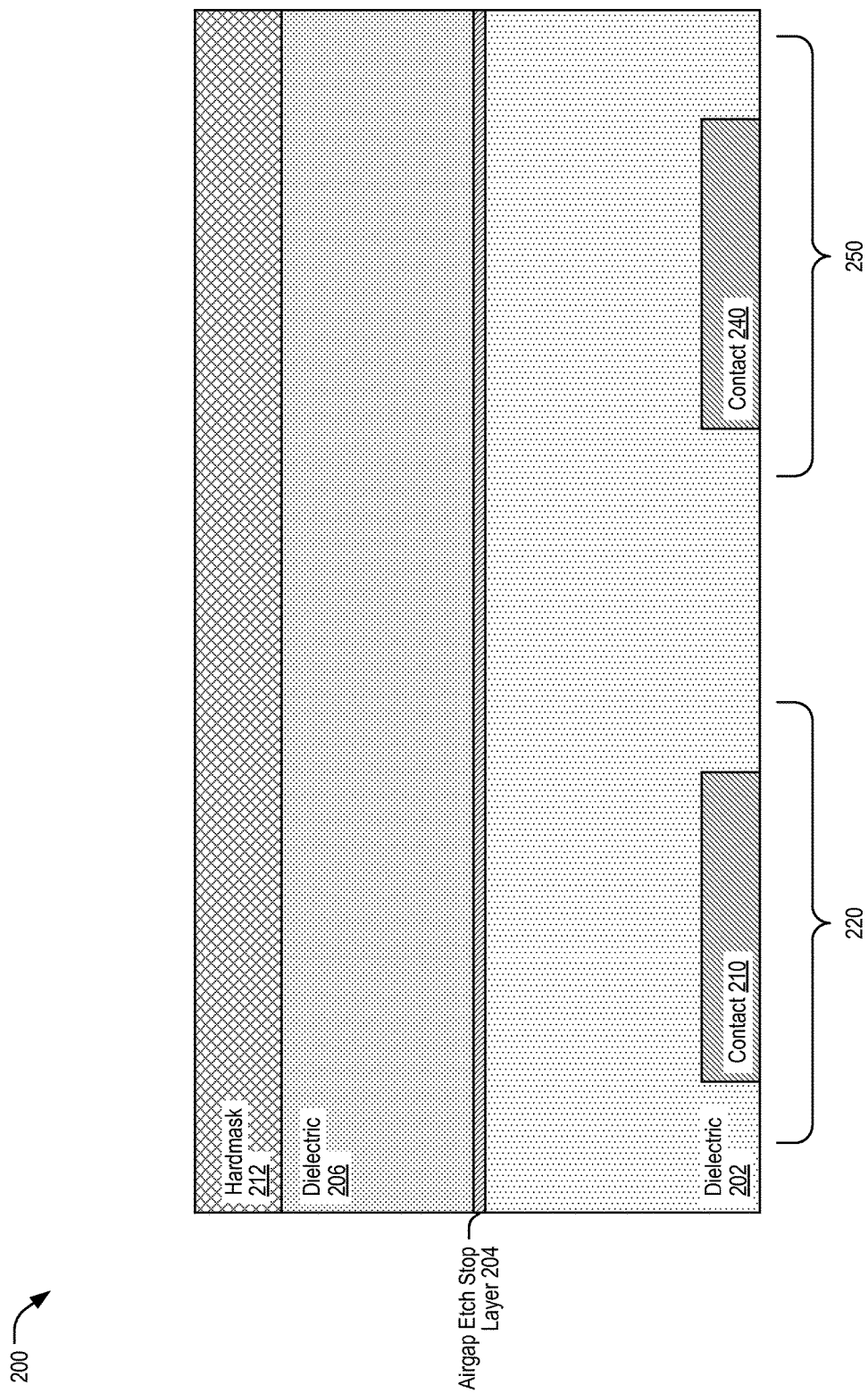
FIG. 2 is a first illustrative diagram of at least one stage of a particular embodiment of a process of fabricating a semiconductor device having an airgap defined at least partially by a protective structure.

Referring to FIG. 2, a first illustrative diagram of at least one stage of a process of fabricating a semiconductor device having an airgap defined at least in part by a protective structure is depicted and generally designated 200. The semiconductor device may correspond to the semiconductor device 100 of FIG. 1. The semiconductor device is depicted after deposition of a first dielectric material 202 (e.g., a first dielectric layer), deposition of an airgap etch stop layer 204, deposition of a second dielectric 206 (e.g., a second dielectric layer), and deposition of a hardmask 212 (e.g., titanium nitride (TiN)). The first dielectric material 202 and the airgap etch stop layer 204 (e.g., an etch stop layer (ESL)) may correspond to the dielectric material 102 and the airgap etch stop layer 104 of FIG. 1, respectively.

The first dielectric material 202 may be a same material as or a different material than the second dielectric material 206. For example, one or both of the first dielectric material 202 and the second dielectric material 206 may include an oxide material, a low k dielectric material, or a combination thereof.

The airgap etch stop layer 204 may include one or more materials resistive to an etch process. For example, the airgap etch stop layer 204 may include silicon nitride (SiN), silicon carbon nitride (SiCN), silicon carbide (SiC), another protective material (e.g., resistant to the etch process used to etch the second dielectric material 206), or any combination thereof. In a particular embodiment, a thickness of the airgap etch stop layer 204 is less than 10 nanometers.

The semiconductor device may include a first portion 220 (e.g., a first region) and a second portion 250 (e.g., a second region). For example, the first portion 220 and the second portion 250 may correspond to the first portion 120 and the second portion 150 of FIG. 1, respectively. The first portion 220 may be associated with a first interconnect and the second portion 250 may be associated with a second interconnect. The formation of the first interconnect and the second interconnect are described further with reference to FIGS. 3-8. The first portion 220 may include a contact 210 and the second portion 250 of the semiconductor device may include a second contact 240. The contact 210 and the second contact 240 may correspond to the first contact 110 and the second contact 140 of FIG. 1, respectively. The contacts 210, 240 may be coupled to one or more structures of another layer, such as a lower layer (not shown), of the semiconductor device or may be used to couple the semiconductor device to another device. In some embodiments, the contacts 210, 240 may be included in a metal layer (Mx), and the first dielectric material 202 is positioned on the metal layer (Mx). Although the contacts 210, 240 are depicted as internal to the first dielectric material 202, the contacts may be external to the first dielectric material 202 in other embodiments. The contacts 210, 240 may include a conductive material, such as a metal (e.g., copper or aluminum), another conductive material, such as a metal alloy, or any combination thereof, as illustrative, non-limiting examples. Although two contacts are illustrated in FIG. 2, the semiconductor device 200 may include more than or less than two contacts. After the first dielectric material 202, the airgap etch stop layer 204, the second dielectric material 206, and the hardmask 212 are deposited, a trenching operation may be applied to one or more of the layers of the semiconductor device to form one or more trenches.

Figure 3:
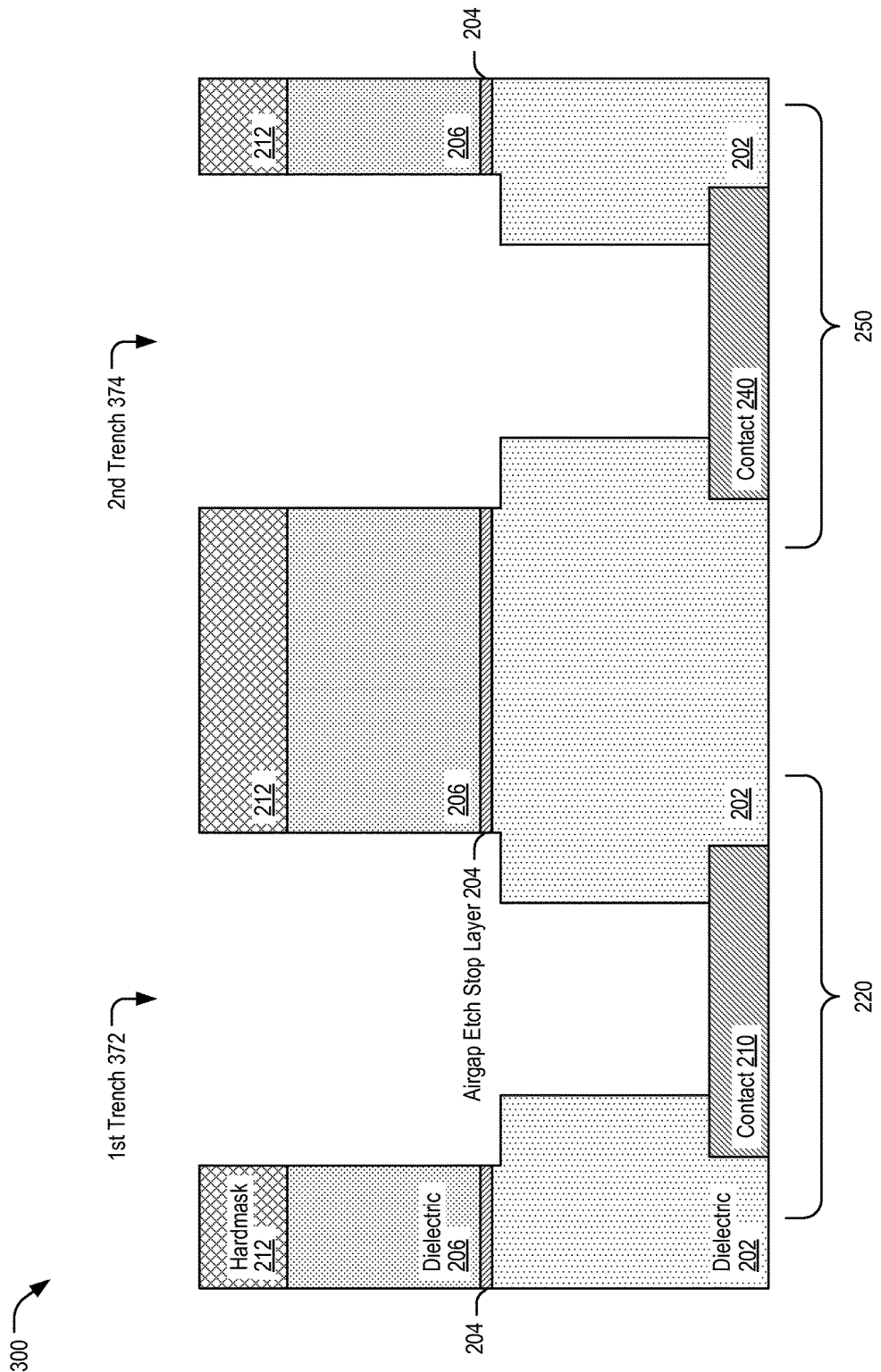
FIG. 3 is a second illustrative diagram of at least one stage of the particular embodiment of the process of fabricating the semiconductor device after performing a trenching operation.

Referring to FIG. 3, a second illustrative diagram of at least one stage of the process of fabricating the semiconductor device after performing a trenching operation is depicted and generally designated 300. The trenching operation may form one or more trenches. For example, the trenching operation may form a first trench 372 in the first portion 220 of the semiconductor device and a second trench 374 in the second portion 250 of the semiconductor device. The first trench 372 may expose a surface of the first contact 210 and the second trench 374 may expose a surface of the second contact 240. The trenching operation may include one or more etch operations to remove portions of the hardmask 212, the second dielectric material 206, the airgap etch stop layer 204, and the first dielectric material 202 to form the first trench 372 and the second trench 374. The trenching operation may be performed as part of a damascene process, such as a dual damascene process. For example, the trenching operation may be performed as part of a process to form a via in the first dielectric material 202, a conductive line (e.g., a metal line, such as a copper line) in the second dielectric material 206, or both.

Figure 4:
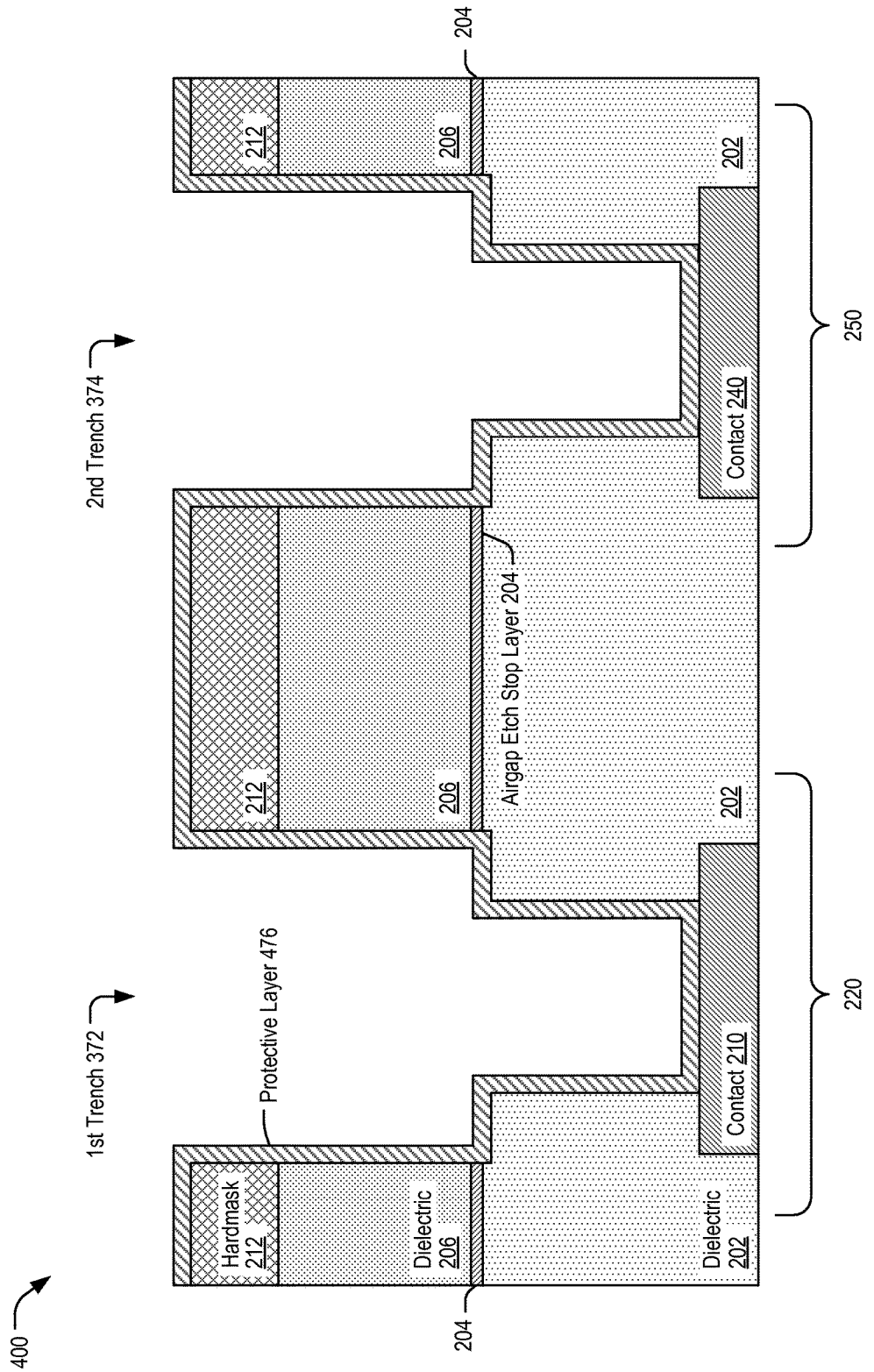
FIG. 4 is a third illustrative diagram of at least one stage of the particular embodiment of the process of fabricating the semiconductor device after depositing a protective layer.

Referring to FIG. 4, a third illustrative diagram of at least one stage of the process of fabricating the semiconductor device, after depositing a protective layer is depicted and generally designated 400. A protective layer 476 may be deposited (e.g., conformally deposited) on exposed structures (e.g., exposed surfaces) of the semiconductor device. For example, the protective layer 476 may be deposited on exposed portions (e.g., sidewalls and horizontal surfaces) of the hardmask 212, of the second dielectric material 206, of the airgap etch stop layer 204, and of the first dielectric 202. The protective layer 476 may include or be associated with the protective structures 122, 124, 152, 154 of FIG. 1.

The protective layer 476 may include silicon nitride (SiN), silicon carbon nitride (SiCN), silicon carbide (SiC), another protective material (e.g., a material resistive to the etch process), or any combination thereof, as illustrative, non-limiting examples. For example, the protective layer 476 may be resistive to an etch process performed to remove the second dielectric material 206, as described further herein.

Figure 5:
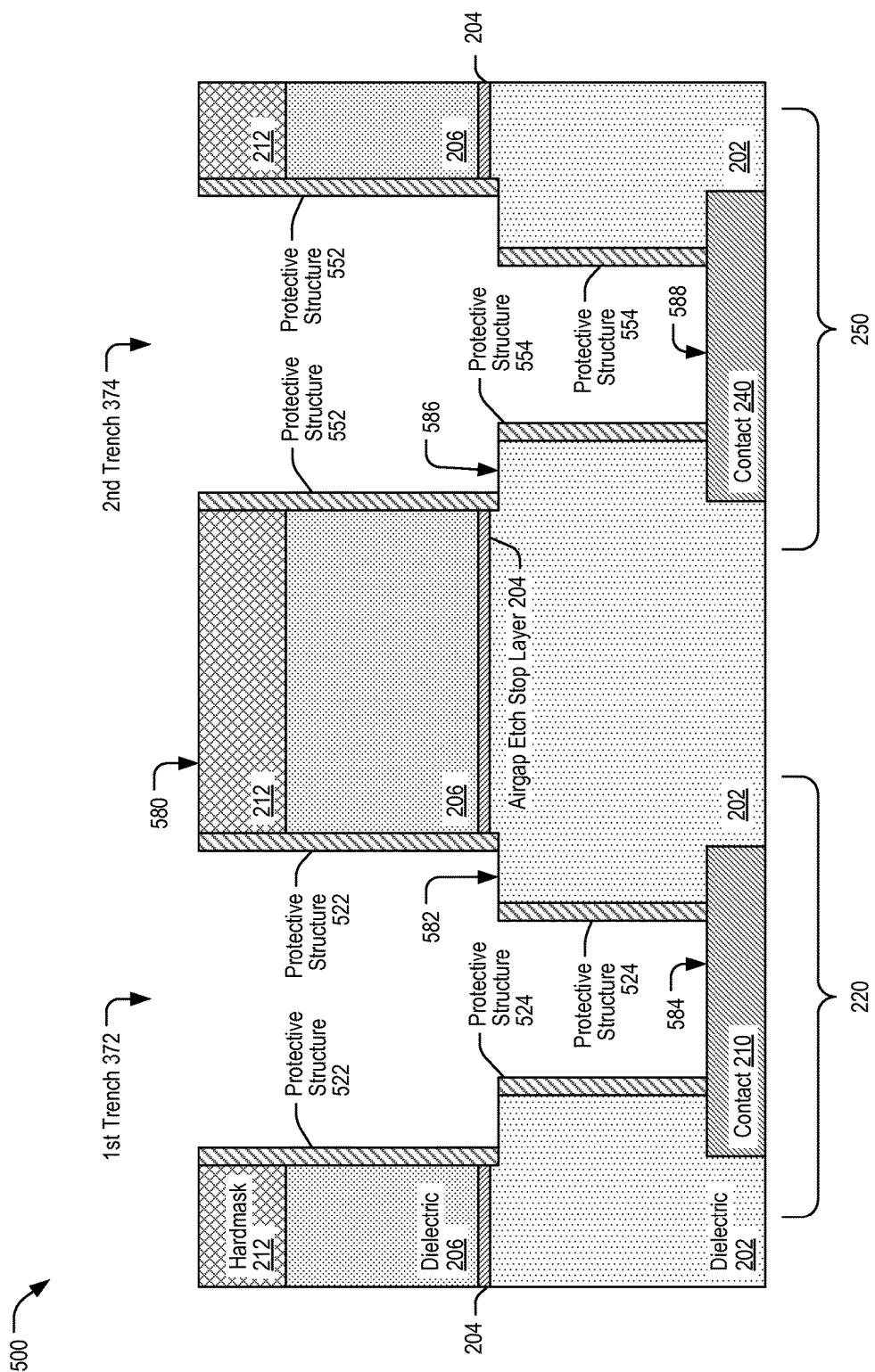
FIG. 5 is a fourth illustrative diagram of at least one stage of the particular embodiment of the process of fabricating the semiconductor device after an etch process.

Referring to FIG. 5, a fourth illustrative diagram of at least one stage of the process of fabricating the semiconductor device, after performing an etch process, is depicted and generally designated 500. The semiconductor device may include one or more protective structures. For example, the semiconductor device may include a protective structure 522 on a first portion (e.g., a sidewall) of the first trench 372, a protective structure 524 on a second portion of the first trench 372, a protective structure 552 on a first portion of the second trench 374, and a protective structure 554 on a second portion of the second trench 374. The protective structures 522-554 may correspond to the protective layer 476 of FIG. 4 after the etch process has been performed.

The etch process may have removed horizontal portions (e.g., horizontally exposed surfaces, such as lateral surfaces) of the protective layer 476. For example, the etch process may have included a directional etch process used to remove a first portion of the protective layer 476 to expose a horizontal surface 580 of the hardmask 212, to remove a second portion of the protective layer 476 to expose a first horizontal surface 582 of the first dielectric material 202, and to remove a third portion of the protective layer 476 to expose a horizontal surface 584 of the first contact 210. Removal of the first portion, the second portion, and the third portion of the protective layer 476 defines the protective structure 522 and the protective structure 524. The directional etch process may further include removal of a fourth portion of the protective layer 476 to expose a second horizontal surface 586 of the first dielectric material 202 and removal of a fifth portion of the protective layer 476 to expose a horizontal surface 588 of the second contact 240. Removal of the fourth portion and the fifth portion of the protective layer 476 defines the protective structure 552 and the protective structure 554. The protective structures 522, 524, 552, 554 may correspond to the protective structures 122, 124, 152, 154 of FIG. 1. In a particular embodiment, the etch process used to etch the protective layer 476 may be an anisotropic etch process.

Figure 6:
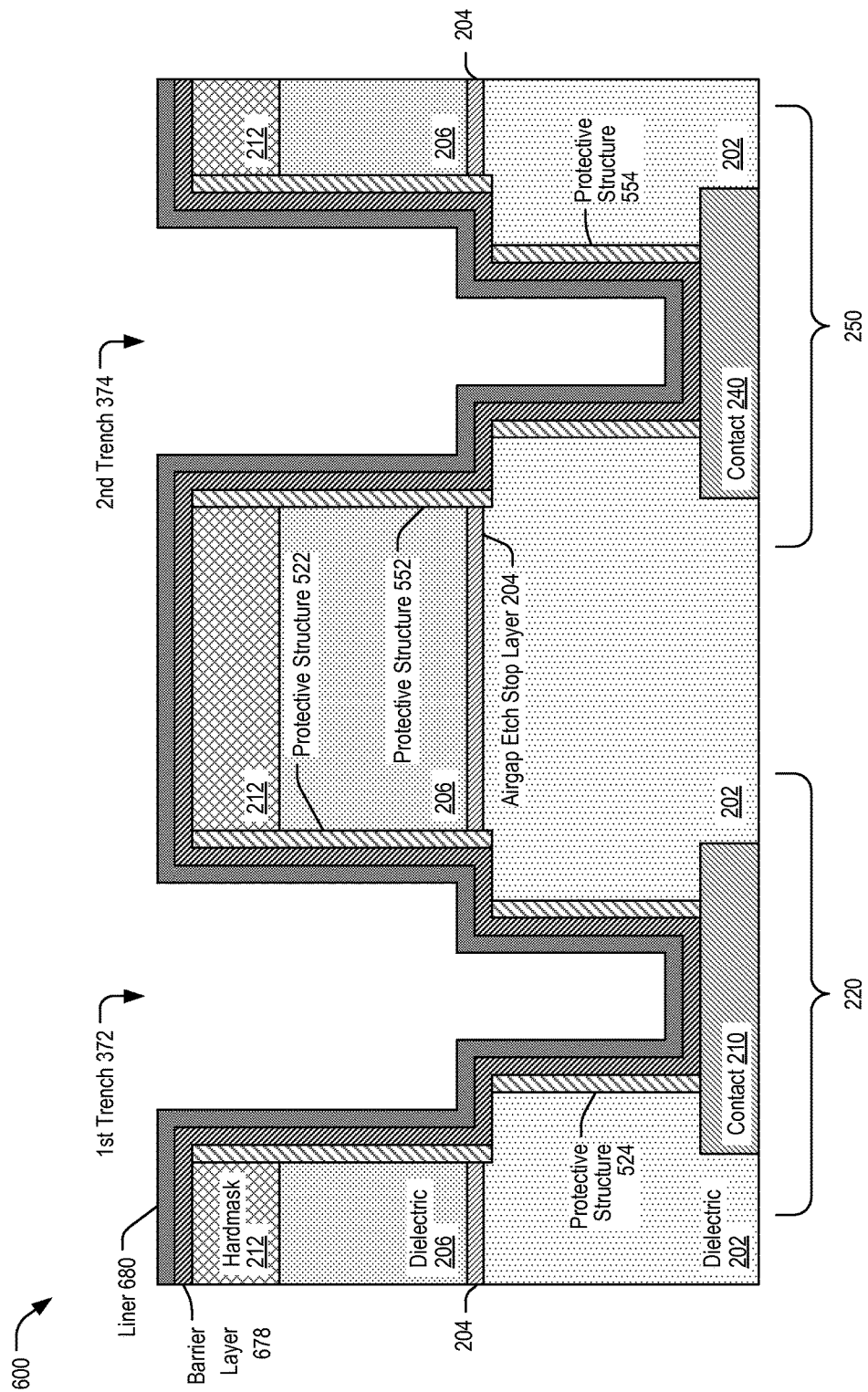
FIG. 6 is a fifth illustrative diagram of at least one stage of the particular embodiment of the process of fabricating the semiconductor device after a deposition process.

Referring to FIG. 6, a fifth illustrative diagram of at least one stage of the process of fabricating the semiconductor device, after performing one or more deposition processes, is depicted and generally designated 600. As illustrated in FIG. 6, a barrier material may be deposited on the semiconductor device to form a barrier layer 678. A liner material may be deposited on the barrier layer 678 to form a liner 680 (e.g., a liner layer). For example, the liner 680 may include or may be associated with the liner structures 134, 164 of FIG. 1.

The barrier layer 678 may be in contact with the one or more protective structures 522, 524, 552, 554, the first dielectric material 202, and the hardmask 212. The barrier layer 678 may resist diffusion of a conductive material (described herein with reference to FIG. 7) into a dielectric layer. The barrier layer 678 may include tantalum (Ta), titanium nitride (TiN), another material to prevent diffusion of a conductive material, or any combination thereof. Although FIG. 6 shows the barrier layer 678 in contact with the one or more protective structures 522, 524, 552, 554, in other embodiments, one or more additional structures and/or layers may be positioned between the barrier layer 678 and the one or more protective structures 522, 524, 552, 554. For example, one or more buffer layers may be formed between one or more of the protective structures 522, 524, 552, 554 and the barrier layer 678. As an additional example, one or more spacers (e.g., separating structures, passivation structures, etc.) may be formed between one or more of the protective structures 522, 524, 552, 554 and the barrier layer 678.

The liner 680 may include a material, such as tantalum (Ta), as an illustrative, non-limiting example. Although FIG. 6 shows the liner 680 in contact with the barrier layer 678, in other embodiments, one or more additional structures and/or layers (e.g., a buffer layer, a spacer, etc.) may be positioned between the liner 680 and the barrier layer 678.

Figure 7:
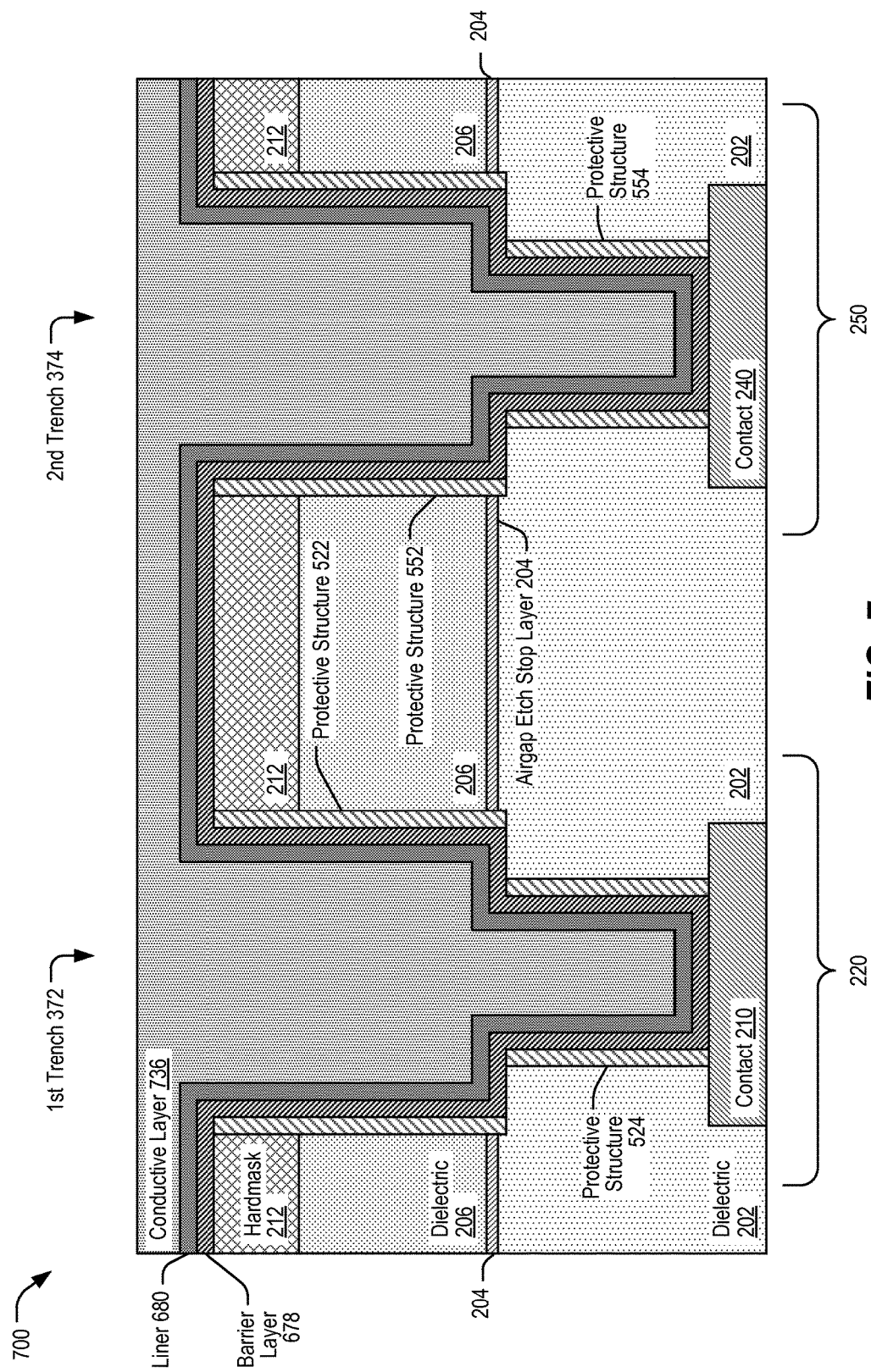
FIG. 7 is a sixth illustrative diagram of at least one stage of the particular embodiment of the process of fabricating the semiconductor device after deposition of one or more conductive layers.

Referring to FIG. 7, a sixth illustrative diagram of at least one stage of the process of fabricating the semiconductor device, after deposition of one or more conductive layers, is depicted and generally designated 700. As illustrated in FIG. 7, one or more conductive materials may be deposited on the liner 680 to form a conductive layer 736. To illustrate, the conductive material may be deposited in the first trench 372 and in the second trench 374. The conductive material may fill the trenches 372, 374. The barrier layer 678 of FIG. 6 may protect the protective structures 522, 524, 552, 554 and/or the dielectric material 202 from diffusion of the conductive material. In a particular embodiment, the conductive layer 736 includes a metal and may be deposited using an electroplating process. The electroplating process may be facilitated by a seed layer deposited at least on one or more exposed surfaces of the first trench 372 and/or one or more exposed surfaces of the second trench 274. For example, the seed layer may be deposited on the liner 680. The seed layer may include a material that attracts a material of the conductive layer 736 under electroplating conditions. The seed layer and the conductive layer 736 may include a same material or a different material. For example, the conductive layer 736 and/or the seed layer may include a metal (e.g., aluminum or copper), a metal alloy, another conductive material, or any combination thereof. In a particular embodiment, the conductive layer 736 and the seed layer include copper.

Although FIG. 7 depicts the barrier layer 678 and the liner 680 as being positioned between the conductive layer 732 and the first contact 210, in other embodiments, an additional operation (e.g., an etch or a punch through) may be performed before deposition of the conductive layer 736, such that the conductive layer 736 (and/or the seed layer) may be in contact with the first contact 210. Similarly, the additional operation may be performed such that the conductive layer 736 (and/or the seed layer) may be in contact with the second contact 240.

Figure 8:
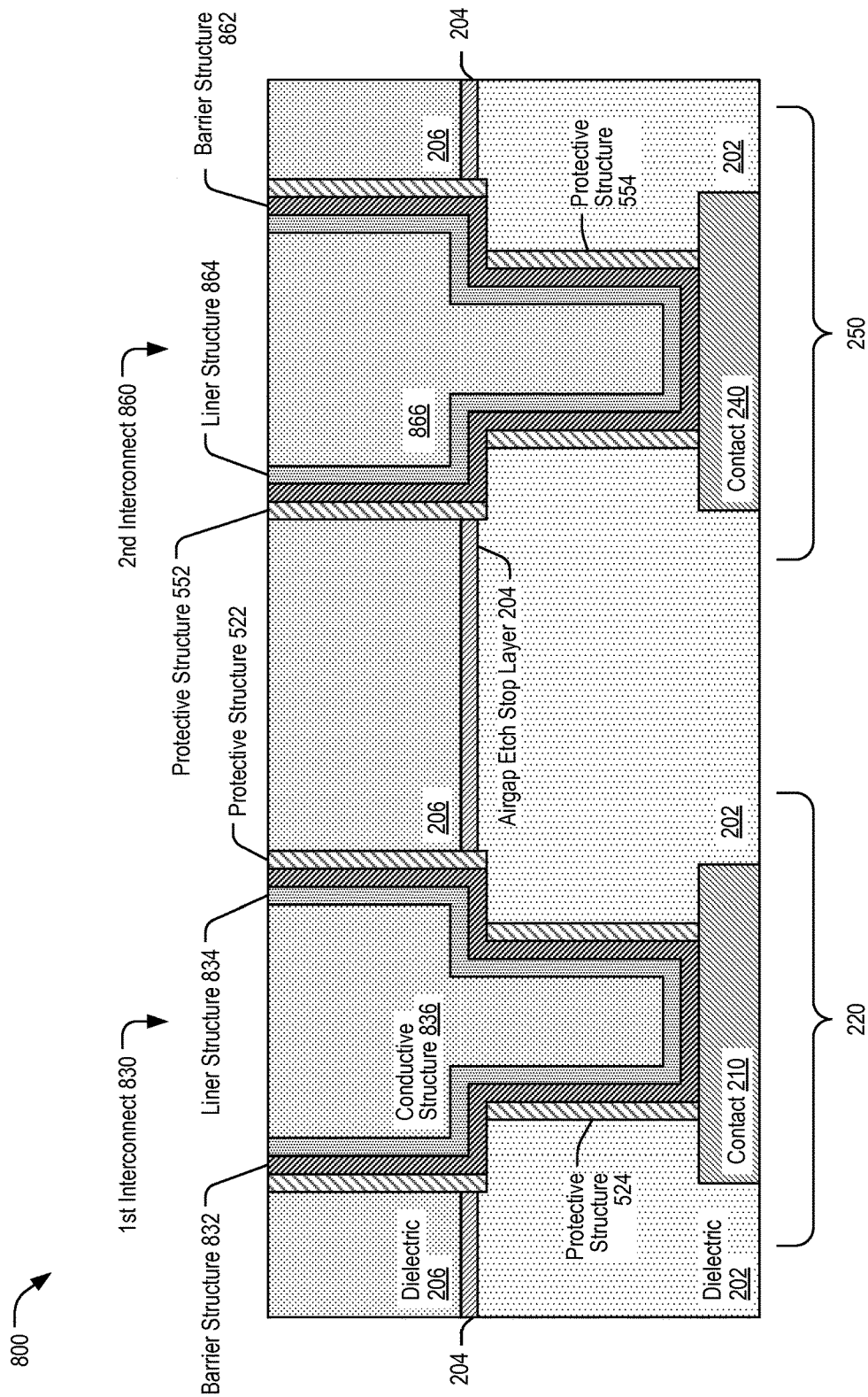
FIG. 8 is a seventh illustrative diagram of at least one stage of the particular embodiment of the process of fabricating the semiconductor device after a planarization operation.

Referring to FIG. 8, a seventh illustrative diagram of at least one stage of the process of fabricating the semiconductor device, after performance of a planarization operation, is depicted and generally designated 800. The planarization operation, such as a chemical mechanical planarization (CMP) process, may remove one or more portions of the hardmask 212, the second dielectric 206, the barrier layer 678, the liner 680 of FIG. 6, and/or the conductive layer 736 of FIG. 7. The planarization operation may define a first interconnect 830 and a second interconnect 860. The first interconnect 830 may be associated with the first portion 220 of the semiconductor device and the second interconnect 860 may be associated with the second portion 250 of the semiconductor device. For example, the planarization operation may define a first barrier structure 832, a first liner structure 834, and a first conductive structure 836 associated with the first interconnect 830. As another example, the planarization operation may further define a second barrier structure 862, a second liner structure 864, and a second conductive structure 866 associated with the second interconnect 860.

Portions of the interconnects 830, 860 may be associated with vias and portions of the interconnects 830, 860 may be associated with a line (e.g., a trace), such as a metal line of the semiconductor device. For example, portions (e.g., lower/narrow portions) of the interconnects 830, 860 formed in the first dielectric material 202 may be associated with vias and portions (e.g., upper/wide portions) of the interconnects 830, 860 formed in the second dielectric material 206 may be associated with lines (e.g., metal lines). Although FIG. 8 depicts both the first interconnect 830 and the second interconnect 860 as having trace portions (upper/wide portions) and via portions (lower/narrow portions), in other embodiments, one or both of the first interconnect 830 or the second interconnect 860 may not include a via portion or may not include a line portion.

The first interconnect 830 may include or correspond to the first interconnect 130 of FIG. 1 and the second interconnect 860 may include or correspond to the second interconnect 160 of FIG. 1. To illustrate, the first barrier structure 832, the first liner structure 834, and the first conductive structure 836 may correspond to the first barrier structure 132, the first liner structure 134, and the first conductive structure 136, respectively, of FIG. 1. The second barrier structure 852, the second seed structure 854, and the second conductive structure 856 may correspond to the second barrier structure 162, the second liner structure 164, and the second conductive structure 156, respectively, of FIG. 1.

Figure 9:
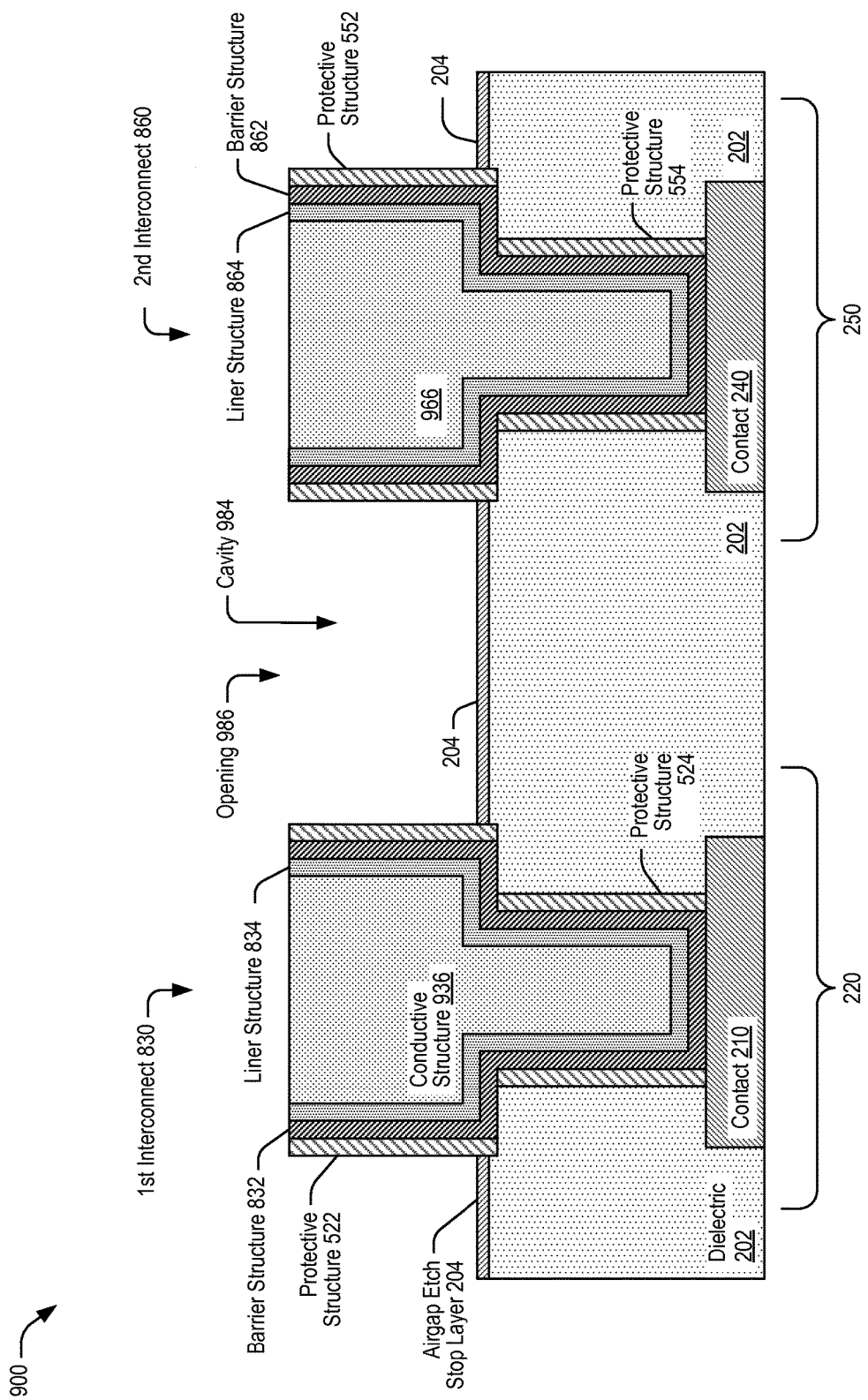
FIG. 9 is an eighth illustrative diagram of at least one stage of the particular embodiment of the process of fabricating the semiconductor device after an etch process.

Referring to FIG. 9, an eighth illustrative diagram of at least one stage of the process of fabricating the semiconductor device, after performing one or more etch operations, is depicted and generally designated 900. The one or more etch operations may form a cavity 984 associated with an airgap, as described further herein. For example, during the one or more etch processes, a portion of the hardmask 212 and a portion of the second dielectric material 206 of FIG. 2 may be removed to form the cavity 984. The cavity 984 may be positioned between the first interconnect 830 and the second interconnect 860 and may include an opening 986. The cavity 984 may expose a portion (e.g., a sidewall) of the protective structure 522, a portion of the protective structure 552, and a portion (e.g., a horizontal surface) of the airgap etch stop layer 204.

During the one or more etch operations, the protective structures 522, 524, 552, 554 may protect the first interconnect 830 and the second interconnect 860, respectively, from damage (e.g., deterioration) caused by the etch process. For example, the protective structures 522, 524, 552, 554 may be resistant to the one or more etch operations used to remove the portion of the second dielectric material 206. The protective structure 522 may protect the first barrier structure 832 and the protective structure 552 may protect the second barrier structure 862 during the etch process. By protecting the first interconnect 830 and the second interconnect 860, reliability of the first interconnect 830 and the second interconnect 860 may be increased, thereby increasing a yield count associated with the semiconductor device as compared to semiconductor devices that do not include protective structures.

In some embodiments, the one or more etch operations may remove at least a portion of the airgap etch stop layer 204. Removal of the portion of the airgap etch stop layer 204 may also remove a portion of the first dielectric 202 and expose a surface of the first dielectric 202. The protective structures 522, 524, 552, 554 may be resistant to the one or more etch operations used to remove the portion of the airgap etch stop layer 204 and the portion of the first dielectric 202.

Figure 10:
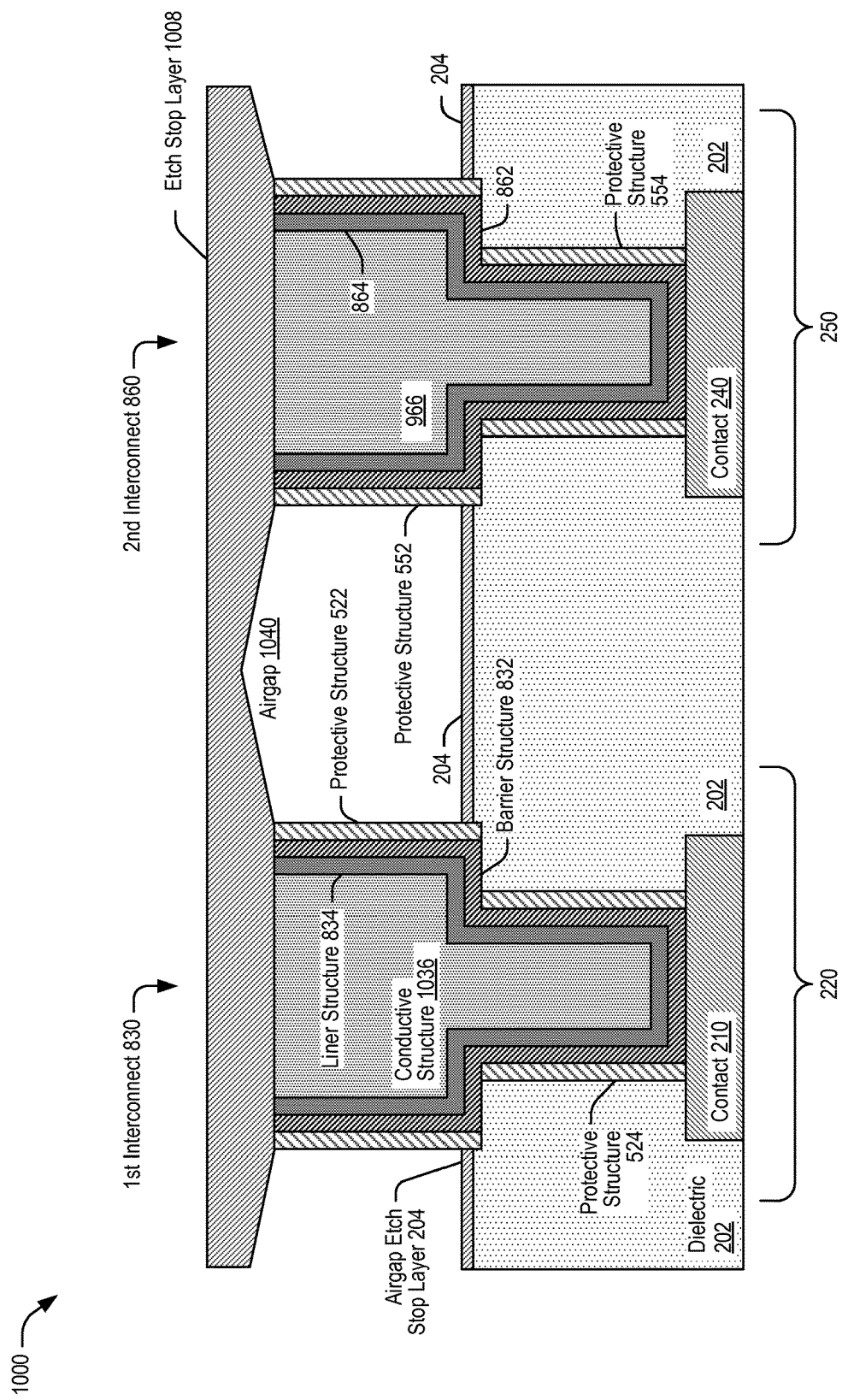
FIG. 10 is a ninth illustrative diagram of at least one stage of the particular embodiment of the process of fabricating the semiconductor device after deposition of an etch stop layer.

Referring to FIG. 10, a ninth illustrative diagram of at least one stage of the process of fabricating the semiconductor device, after deposition of an etch stop layer, is depicted and generally designated 900. As depicted in FIG. 10, an etch stop layer 1008 may be deposited (e.g., nonconformally deposited) on the semiconductor device to form an airgap 1040. For example, the etch stop layer 1008 may seal the opening 986 of the cavity 984 of FIG. 9 to form the airgap 1040. Using an angled directional deposition process to deposit the etch stop layer 1008 in combination with a small size of the cavity 984 may prevent or reduce the amount of material of the etch stop layer 1008 that enters the cavity 984 during the deposition process, thereby forming the airgap 1040. The airgap 1040 may correspond to the airgap 170 of FIG. 1.

The etch stop layer 1008 may include a material that is resistant to one or more etch processes that may be applied to the semiconductor device. For example, the etch stop layer 1008 may be a low k layer and/or an etch stop layer. The etch stop layer 1008 may include silicon nitride (SiN), silicon carbon nitride (SiCN), silicon carbide (SiC), another material that is resistive to the one or more etch processes, or a combination thereof, as illustrative, non-limiting examples. Accordingly, the airgap 1040 may be at least partially defined by the protective structure 522, the airgap etch stop layer 204 (e.g., a first etch stop layer), the protective structure 552, the etch stop layer 1008 (e.g., a second etch stop layer), or a combination thereof. For example, the airgap 1040 may be bounded in three dimensions by components of the semiconductor device. The protective structure 522, the airgap etch stop layer 204, the protective structure 552, the etch stop layer 1008, another structure/layer of the semiconductor device, or a combination thereof may constitute at least a portion of the boundary of the airgap 1040. Although FIG. 10 depicts the etch stop layer 1008 as being in contact with the first interconnect 830 and the second interconnect 860, in some embodiments, a particular layer or a particular structure (e.g., a protection layer or a protection structure distinct from the protective layer 476 of FIG. 4 and distinct from the protective structures 522, 524, 552, 554 of FIG. 5), such as cobalt tungsten phosphide (CoWP) may be deposited over a surface of the first interconnect 830 and over a surface of the second interconnect 860 after the chemical mechanical planarization process described with reference to FIG. 7. The particular layer may be positioned between the etch stop layer 1008 and one or more of the first interconnect 830 and the second interconnect 860. In some embodiments, a portion of the particular layer may constitute at least a portion of the boundary of the airgap 1040.

The semiconductor device may advantageously include one or more of the protective structures 522, 524, 552, 554 that form a boundary of (e.g., define), at least in part, the airgap 1040. The airgap 1040 may reduce a capacitance between the first interconnect 830 and the second interconnect 860 as compared to a semiconductor device that does not include an airgap (e.g., has a dielectric material) between interconnects. Additionally, one or more of the protective structures 522, 524, 552, 554 may protect the first interconnect 830 and the second interconnect 860 during formation of the airgap 1040, such as during an etch process to remove the second dielectric material 206.

Figure 11:
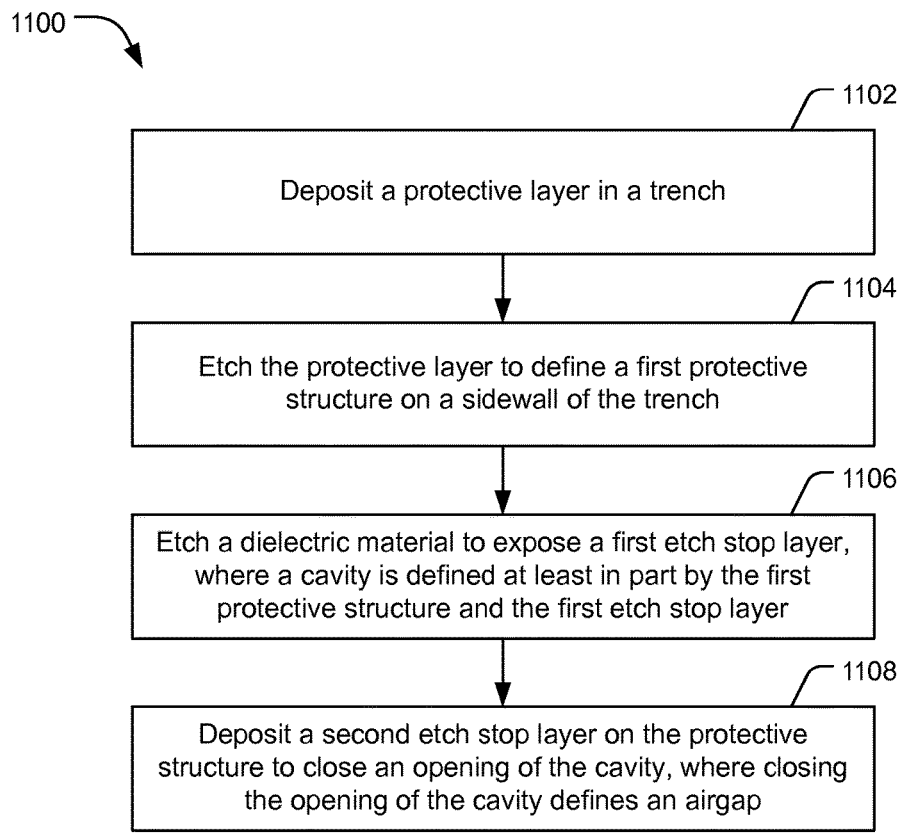
FIG. 11 is a flow diagram of an illustrative embodiment of a method of forming a semiconductor device having an airgap defined at least partially by a protective structure.

Referring to FIG. 11, a flow diagram of an illustrative embodiment of a method 1100 of forming a semiconductor device having an airgap defined at least partially by a protective structure is depicted. For example, the semiconductor device may include the semiconductor device 100 of FIG. 1 or the semiconductor device formed according to the process described with reference to FIGS. 2-10. The airgap may include or correspond to the airgap 170 of FIG. 1 or the airgap 1040 of FIG. 10.

The method 1100 may include depositing a protective layer in a trench, at 1102. For example, referring to FIG. 4, the protective layer 476 may be deposited in the first trench 372.

The method 1100 may further include etching the protective layer to define a first protective structure on a sidewall of the trench, at 1104. The first protective structure may correspond to any of the protective structures 122, 124, 152, 154 of FIG. 1 and/or any of the protective structures 522, 524, 552, 554 of FIG. 5. For example, referring to FIG. 5, the protective structures 522, 524, 552, 554 may be defined by etching the protective layer 476 of FIG. 4. Etching the protective layer may include removing one or more portions of the protective layer. To illustrate, an anisotropic etch process may be used to remove the one or more portions of the protective layer.

The method 1100 may also include etching a dielectric material to expose a first etch stop layer, at 1106. The first etch stop layer may correspond to the airgap etch stop layer 104 of FIG. 1 and/or the airgap etch stop layer 204 of FIG. 2. A cavity may be defined at least in part by the first protective structure and the first etch stop layer. For example, referring to FIG. 9, the cavity 984 may be formed by etching the second dielectric material 206 of FIG. 8. Etching the second dielectric material 206 may expose the airgap etch stop layer 204. The cavity 984 may be defined at least in part by the protective structure 522 and the airgap etch stop layer 204. For example, the cavity may be bounded at least in part by the protective structure 522 and the airgap etch stop layer 204.

The method 1100 may include depositing a second etch stop layer on the protective structure to close an opening of the cavity, at 1108. The second etch stop layer may correspond to the etch stop layer 108 of FIG. 1 and/or the etch stop layer 1008 of FIG. 1. For example, referring to FIG. 10, the etch stop layer 1008 may be deposited on the protective structure 522 to seal an opening (e.g., the opening 986 of the cavity 984 of FIG. 9). Closing the opening may define the airgap, such as the airgap 170 of FIG. 1 or the airgap 1040 of FIG. 10. Using an angled directional deposition process to deposit the second etch stop layer in combination with a small size of the cavity may prevent or reduce the amount of material of the second etch stop layer that enters the cavity during the deposition process, thereby forming the airgap.

The method 1100 may be used to define an airgap positioned between interconnects of a semiconductor device. The airgap may reduce a capacitance between the interconnects. Additionally, the airgap may be defined at least partially by a protective structure, such as the first protective structure. The protective structure may protect one or more of the interconnects during formation of the airgap, such as protecting an interconnect during etching of the dielectric material to expose the first etch stop layer.

The method of FIG. 11 may be implemented by a processing unit such as a central processing unit (CPU), a controller, a field-programmable gate array (FPGA) device, an application-specific integrated circuit (ASIC), a digital signal processor (DSP), another hardware device, firmware device, or any combination thereof. As an example, the method of FIG. 11 can be performed by one or more processors that execute instructions to control fabrication equipment.

In conjunction with one or more of the described embodiments of FIGS. 1-11, an apparatus is disclosed that may include means (e.g., a barrier layer) for resisting diffusion of a conductive material of an interconnect into a dielectric layer of a semiconductor device. The means for resisting diffusion may be in contact with the dielectric layer. The means for resisting diffusion may correspond to the first barrier structure 132 of FIG. 1, the second barrier structure 162 of FIG. 1, the first barrier structure 832 of FIGS. 8-10, the second barrier structure 862 of FIGS. 8-10, one or more other structures configured to resist diffusion, or any combination thereof.

The apparatus may also include means for defining an airgap. The means for defining an airgap may be in contact with the means for resisting. The means for defining an airgap may correspond to the protective structure 122, the airgap etch stop layer 104, the etch stop layer 108, the protective structure 152 of FIG. 1, the airgap etch stop layer 204 of FIGS. 2-10, the protective structure 522, the protective structure 552 of FIGS. 5-10, the etch stop layer 1008 of FIG. 10, one or more other structures configured to define an airgap, or any combination thereof.

In conjunction with the described embodiments of FIGS. 1-11, a method is disclosed that may include a first step for depositing a protective layer in a trench. The first step may correspond to the process described with reference to FIG. 4, to the method 1100 of FIG. 11 at 1102, to one or more other processes configured to deposit a protective layer in a trench, or any combination thereof.

The method may also include a second step for etching the protective layer to define a first protective structure on a sidewall of the trench. The second step may correspond to the process described with reference to FIG. 5, to the method 1100 of FIG. 11 at 1104, to one or more other processes configured to etch a protective layer to define a protective structure on a sidewall of a trench, or any combination thereof.

The method may also include a third step for etching a dielectric material to expose an etch stop layer. The third step may correspond to the process described with reference to FIG. 9, to the method 1100 of FIG. 11 at 1106, to one or more other processes configured to etch a dielectric material, or any combination thereof.

Figure 12:
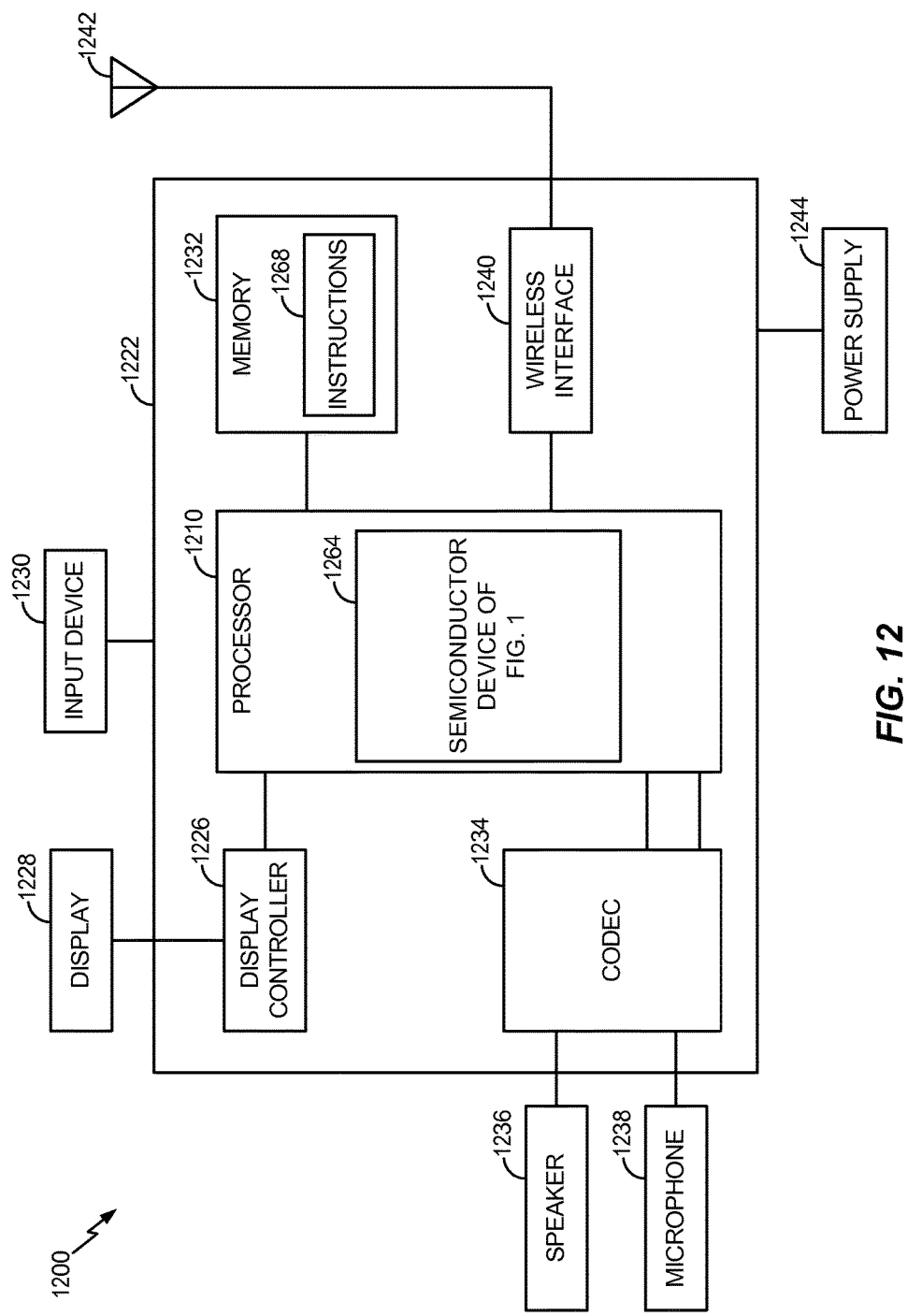
FIG. 12 is a block diagram of a device including the semiconductor device of FIG. 1.

Referring to FIG. 12, a block diagram of a particular illustrative embodiment of an electronic device 1200, such as a wireless communication device is depicted. The electronic device 1200 may include the semiconductor device 100 of FIG. 1, a semiconductor device formed according to the process illustrated by FIGS. 2-10, a semiconductor device formed using the method of FIG. 11, or a combination thereof.

The electronic device 1200 includes a processor 1210, such as a digital signal processor (DSP), coupled to a memory 1232. The processor 1210 may include a semiconductor device 1264. For example, the semiconductor device 1264 may be the semiconductor device 100 of FIG. 1, a semiconductor device formed according to the process illustrated by FIGS. 2-10, a semiconductor device formed using the method of FIG. 11, or a combination thereof. To illustrate, the processor 1210 may be constructed in such a way that components of the processor 1210 may be electrically connected by structures, such as the first interconnect 130 and/or the second interconnect 160 of FIG. 1. The processor 1210 may further be constructed in such a way that the processor 1210 includes one or more of the protective structures 122, 124, 152, 154. An airgap, such as the airgap 170 of FIG. 1, may be positioned between components/structures of the processor 1210, such as the first interconnect 130 and/or the second interconnect 160.

The memory 1232 includes instructions 1268 (e.g., executable instructions) such as computer-readable instructions or processor-readable instructions. The instructions 1268 may include one or more instructions that are executable by a computer, such as the processor 1210.

FIG. 12 also shows a display controller 1226 that is coupled to the processor 1210 and to a display 1228. A coder/decoder (CODEC) 1234 can also be coupled to the processor 1210. A speaker 1236 and a microphone 1238 can be coupled to the CODEC 1234.

FIG. 12 also indicates that a wireless interface 1240, such as a wireless controller, can be coupled to the processor 1210 and to an antenna 1242. In a particular embodiment, the processor 1210, the display controller 1226, the memory 1232, the CODEC 1234, and the wireless interface 1240 are included in a system-in-package or system-on-chip device 1222. In a particular embodiment, an input device 1230 and a power supply 1244 are coupled to the system-on-chip device 1222. Moreover, in a particular embodiment, as illustrated in FIG. 12, the display 1228, the input device 1230, the speaker 1236, the microphone 1238, the antenna 1242, and the power supply 1244 are external to the system-on-chip device 1222. However, each of the display 1228, the input device 1230, the speaker 1236, the microphone 1238, the antenna 1242, and the power supply 1244 can be coupled to a component of the system-on-chip device 1222, such as an interface or a controller. Although the semiconductor device 1264 is depicted as being included in the processor 1210, the semiconductor device 1264 may be included in another component of the device 1200 or a component coupled to the device 1200. For example, the semiconductor device 1264 may be included in the memory 1232, the wireless interface 1240, the power supply 1244, the input device 1230, the display 1228, the display controller 1226, the CODEC 1234, the speaker 1236, or the microphone 1238. To illustrate, one or more of the components of the electronic device 1200 may include a semiconductor device that is constructed in such a way that components of the semiconductor device may be electrically connected by structures/interconnects (e.g., corresponding to the first interconnect 130 of FIG. 1 and/or to the second interconnect 160). The interconnects may be used to route power/signals between circuits of the semiconductor device. The interconnects may be separated by an airgap (e.g., the airgap 170 of FIG. 1) and may be protected by one or more protective structures (e.g., the protective structure 522 and/or the protective structure 552).

One or more of the disclosed embodiments may be implemented in a system or an apparatus, such as the electronic device 1200, that may include a communications device, a fixed location data unit, a mobile location data unit, a mobile phone, a cellular phone, a satellite phone, a computer, a tablet, a portable computer, or a desktop computer. Alternatively or additionally, the electronic device 1200 may include a set top box, an entertainment unit, a navigation device, a personal digital assistant (PDA), a monitor, a computer monitor, a television, a tuner, a radio, a satellite radio, a music player, a digital music player, a portable music player, a video player, a digital video player, a digital video disc (DVD) player, a portable digital video player, any other device that stores or retrieves data or computer instructions, or a combination thereof. As another illustrative, non-limiting example, the system or the apparatus may include remote units, such as hand-held personal communication systems (PCS) units, portable data units such as global positioning system (GPS) enabled devices, meter reading equipment, or any other device that stores or retrieves data or computer instructions, or any combination thereof.

Figure 13:
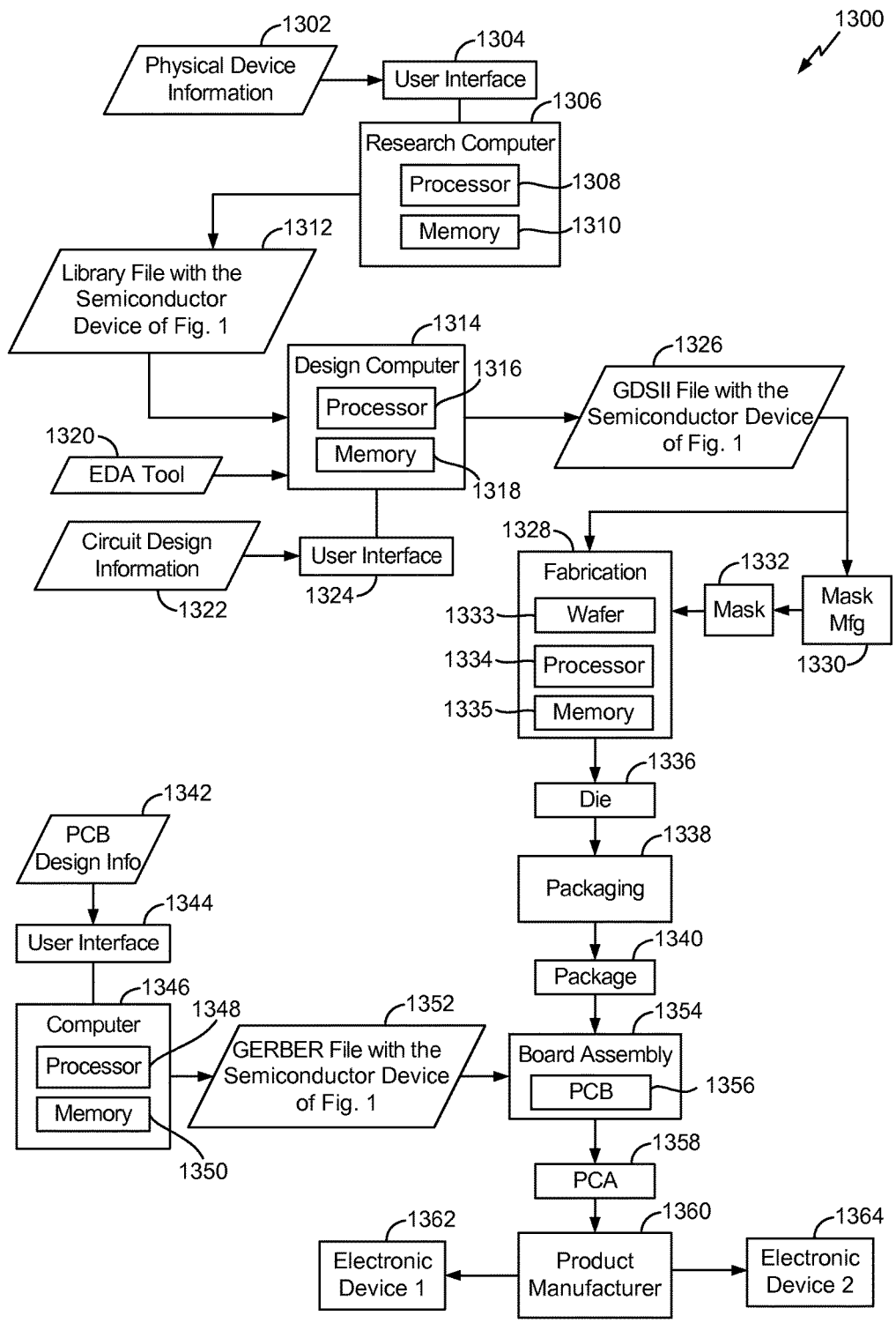
FIG. 13 is a data flow diagram of an illustrative embodiment of a manufacturing process to fabricate a device including the semiconductor device of FIG. 1.

The foregoing disclosed devices and functionalities may be designed and configured into computer files (e.g. RTL, GDSII, GERBER, etc.) stored on computer-readable media. Some or all such files may be provided to fabrication handlers who fabricate devices based on such files. Resulting products include semiconductor wafers that are then cut into semiconductor die and packaged into a semiconductor chip. The chips are then employed in devices described above. FIG. 13 depicts a particular illustrative embodiment of an electronic device manufacturing process 1300.

Physical device information 1302 is received at the manufacturing process 1300, such as at a research computer 1306. The physical device information 1302 may include design information representing at least one physical property of a semiconductor device, such as the semiconductor device 100 of FIG. 1, a semiconductor device formed according to the process illustrated by FIGS. 2-10, a semiconductor device formed using the method of FIG. 11, or a combination thereof. For example, the physical device information 1302 may include physical parameters, material characteristics, and structure information that is entered via a user interface 1304 coupled to the research computer 1306. The research computer 1306 includes a processor 1308, such as one or more processing cores, coupled to a computer-readable medium (e.g., a non-transitory computer-readable medium), such as a memory 1310. The memory 1310 may store computer-readable instructions that are executable to cause the processor 1308 to transform the physical device information 1302 to comply with a file format and to generate a library file 1312.

In a particular embodiment, the library file 1312 includes at least one data file including the transformed design information. For example, the library file 1312 may include a library of semiconductor devices including a device that includes the semiconductor device 100 of FIG. 1, a semiconductor device formed according to the process illustrated by FIGS. 2-10, a semiconductor device formed using the method of FIG. 11, or a combination thereof, that is provided for use with an electronic design automation (EDA) tool 1320.

The library file 1312 may be used in conjunction with the EDA tool 1320 at a design computer 1314 including a processor 1316, such as one or more processing cores, coupled to a memory 1318. The EDA tool 1320 may be stored as processor executable instructions at the memory 1318 to enable a user of the design computer 1314 to design a circuit including the semiconductor device 100 of FIG. 1, a semiconductor device formed according to the process illustrated by FIGS. 2-10, a semiconductor device formed using the method of FIG. 11, or a combination thereof. For example, a user of the design computer 1314 may enter circuit design information 1322 via a user interface 1324 coupled to the design computer 1314. The circuit design information 1322 may include design information representing at least one physical property of a semiconductor device, such as the semiconductor device 100 of FIG. 1, a semiconductor device formed according to the process illustrated by FIGS. 2-10, a semiconductor device formed using the method of FIG. 11, or a combination thereof. To illustrate, the circuit design property may include identification of particular circuits and relationships to other elements in a circuit design, positioning information, feature size information, interconnection information, or other information representing a physical property of a semiconductor device.

The design computer 1314 may be configured to transform the design information, including the circuit design information 1322, to comply with a file format. To illustrate, the file format may include a database binary file format representing planar geometric shapes, text labels, and other information about a circuit layout in a hierarchical format, such as a Graphic Data System (GDSII) file format. The design computer 1314 may be configured to generate a data file including the transformed design information, such as a GDSII file 1326 that includes information describing the semiconductor device 100 of FIG. 1, a semiconductor device formed according to the process illustrated by FIGS. 2-10, a semiconductor device formed using the method of FIG. 11, or a combination thereof, in addition to other circuits or information. To illustrate, the data file may include information corresponding to a system-on-chip (SOC) that includes the semiconductor device 100 of FIG. 1, a semiconductor device formed according to the process illustrated by FIGS. 2-10, a semiconductor device formed using the method of FIG. 11, or a combination thereof, and that also includes additional electronic circuits and components within the SOC.

The GDSII file 1326 may be received at a fabrication process 1328 to manufacture the semiconductor device 100 of FIG. 1, a semiconductor device formed according to the process illustrated by FIGS. 2-10, a semiconductor device formed using the method of FIG. 11, or a combination thereof, according to transformed information in the GDSII file 1326. For example, a device manufacture process may include providing the GDSII file 1326 to a mask manufacturer 1330 to create one or more masks, such as masks to be used with photolithography processing, illustrated as a representative mask 1332. The mask 1332 may be used during the fabrication process to generate one or more wafers 1333, which may be tested and separated into dies, such as a representative die 1336. The die 1336 includes a circuit including a device that includes the semiconductor device 100 of FIG. 1, a semiconductor device formed according to the process illustrated by FIGS. 2-10, a semiconductor device formed using the method of FIG. 11, or a combination thereof. To illustrate, the first interconnect 130 and one or more of the protective structures 122, 124, 152, 154 may be integrated into the die 1336.

For example, the fabrication process 1328 may include a processor 1334 and a memory 1335 to initiate and/or control the fabrication process 1328. The memory 1335 may include executable instructions such as computer-readable instructions or processor-readable instructions. The executable instructions may include one or more instructions that are executable by a computer such as the processor 1334.

The fabrication process 1328 may be implemented by a fabrication system that is fully automated or partially automated. For example, the fabrication process 1328 may be automated according to a schedule. The fabrication system may include fabrication equipment (e.g., processing tools) to perform one or more operations to form a semiconductor device. For example, the fabrication equipment may be configured to deposit one or more materials, etch one or more protective materials, etch one or more dielectric materials, etch one or more etch stop layers, perform a chemical mechanical planarization process, etc.

The fabrication system (e.g., an automated system that performs the fabrication process 1328) may have a distributed architecture (e.g., a hierarchy). For example, the fabrication system may include one or more processors, such as the processor 1334, one or more memories, such as the memory 1335, and/or controllers that are distributed according to the distributed architecture. The distributed architecture may include a high-level processor that controls or initiates operations of one or more low-level systems. For example, a high-level portion of the fabrication process 1328 may include one or more processors, such as the processor 1334, and the low-level systems may each include or may be controlled by one or more corresponding controllers. A particular controller of a particular low-level system may receive one or more instructions (e.g., commands) from a particular high-level system, may issue sub-commands to subordinate modules or process tools, and may communicate status data back to the particular high-level. Each of the one or more low-level systems may be associated with one or more corresponding pieces of fabrication equipment (e.g., processing tools). In a particular embodiment, the fabrication system may include multiple processors that are distributed in the fabrication system. For example, a controller of a low-level system component may include a processor, such as the processor 1334.

Alternatively, the processor 1334 may be a part of a high-level system, subsystem, or component of the fabrication system. In another embodiment, the processor 1334 includes distributed processing at various levels and components of a fabrication system.

Thus, the processor 1334 may include processor-executable instructions that, when executed by the processor 1334, cause the processor 1334 to initiate or control formation of a semiconductor device, the semiconductor device formed by depositing a protective layer in a trench, etching the protective layer to define a first protective structure on a sidewall of the trench, and etching a dielectric material to expose an etch stop layer.

The executable instructions included in the memory 1335 may enable the processor 1334 to initiate formation of a semiconductor device such as the semiconductor device 100 of FIG. 1, a semiconductor device formed according to the process illustrated by FIGS. 2-10, a semiconductor device formed using the method of FIG. 11, or a combination thereof. In a particular embodiment, the memory 1335 is a non-transient computer-readable medium storing computer-executable instructions that are executable by the processor 1334 to cause the processor 1334 to initiate formation of a semiconductor device in accordance with at least a portion of any of the processes illustrated FIGS. 2-10, at least a portion of the method of FIG. 11, or any combination thereof. For example, the computer executable instructions may be executable to cause the processor 1334 to initiate formation of the semiconductor device, such as the semiconductor device 100 of FIG. 1. The semiconductor device may be formed by depositing a protective layer in a trench, etching the protective layer to define a first protective structure on a sidewall of the trench, and etching a dielectric material to expose an etch stop layer.

As an illustrative example, the processor 1334 may initiate or control a first step for depositing a protective layer in a trench. For example, the processor 1334 may be embedded in or coupled to one or more controllers that control one or more pieces of fabrication equipment to perform the first step for depositing a protective layer in a trench. The processor 1334 may control the first step for depositing a protective layer in a trench by controlling one or more processes as described by the method 1100 of FIG. 11 at 1102, by one or more other processes configured to deposit a protective layer in a trench, or any combination thereof.

The processor 1334 may also control a second step for etching the protective layer to define a first protective structure on a sidewall of the trench. For example, the processor 1334 may be embedded in or coupled to one or more controllers that control one or more pieces of fabrication equipment to perform the second step for etching the protective layer to define a first protective structure on a sidewall of the trench. The processor 1334 may control the second step perform the second step for etching the protective layer to define a first protective structure on a sidewall of the trench by controlling one or more processes as described by the method 1100 of FIG. 11 at 1104, by one or more other processes configured to etch a protective layer to define a protective structure on a sidewall of a trench, or any combination thereof.

The processor 1334 may also control a third step for etching a dielectric material to expose an etch stop layer. For example, the processor 1334 may be embedded in or coupled to one or more controllers that control one or more pieces of fabrication equipment to perform the third step for etching a dielectric material to expose an etch stop layer. The processor 1334 may control the third step for etching a dielectric material to expose an etch stop layer by controlling one or more processes as described by the method 1100 of FIG. 11 at 1106, by one or more other processes configured to etch a dielectric material, or any combination thereof.

The die 1336 may be provided to a packaging process 1338 where the die 1336 is incorporated into a representative package 1340. For example, the package 1340 may include the single die 1336 or multiple dies, such as a system-in-package (SiP) arrangement. The package 1340 may be configured to conform to one or more standards or specifications, such as Joint Electron Device Engineering Council (JEDEC) standards.

Information regarding the package 1340 may be distributed to various product designers, such as via a component library stored at a computer 1346. The computer 1346 may include a processor 1348, such as one or more processing cores, coupled to a memory 1350. A printed circuit board (PCB) tool may be stored as processor executable instructions at the memory 1350 to process PCB design information 1342 received from a user of the computer 1346 via a user interface 1344. The PCB design information 1342 may include physical positioning information of a packaged semiconductor device on a circuit board, the packaged semiconductor device corresponding to the package 1340 including the semiconductor device 100 of FIG. 1, a semiconductor device formed according to the process illustrated by FIGS. 2-10, a semiconductor device formed using the method of FIG. 11, or a combination thereof.

The computer 3946 may be configured to transform the PCB design information 3942 to generate a data file, such as a GERBER file 3952 with data that includes physical positioning information of a packaged semiconductor device on a circuit board, as well as layout of electrical connections such as traces (e.g., metal lines) and vias, where the packaged semiconductor device corresponds to the package 3940 including the semiconductor device 100 of FIG. 1, a semiconductor device formed according to the process illustrated by FIGS. 2-10, a semiconductor device formed using the method of FIG. 11, or a combination thereof. In other embodiments, the data file generated by the transformed PCB design information may have a format other than a GERBER format.

The GERBER file 1352 may be received at a board assembly process 1354 and used to create PCBs, such as a representative PCB 1356, manufactured in accordance with the design information stored within the GERBER file 1352. For example, the GERBER file 1352 may be uploaded to one or more machines to perform various steps of a PCB production process. The PCB 1356 may be populated with electronic components including the package 1340 to form a representative printed circuit assembly (PCA) 1358.

The PCA 1358 may be received at a product manufacture process 1360 and integrated into one or more electronic devices, such as a first representative electronic device 1362 and a second representative electronic device 1364. For example, the first representative electronic device 1362, the second representative electronic device 1364, or both, may include or correspond to the wireless communication device 1200 of FIG. 12. As an illustrative, non-limiting example, the first representative electronic device 1362, the second representative electronic device 1364, or both, may include a communications device, a fixed location data unit, a mobile location data unit, a mobile phone, a cellular phone, a satellite phone, a computer, a tablet, a portable computer, or a desktop computer. Alternatively or additionally, the first representative electronic device 1362, the second representative electronic device 1364, or both, may include a set top box, an entertainment unit, a navigation device, a personal digital assistant (PDA), a monitor, a computer monitor, a television, a tuner, a radio, a satellite radio, a music player, a digital music player, a portable music player, a video player, a digital video player, a digital video disc (DVD) player, a portable digital video player, any other device that stores or retrieves data or computer instructions, or a combination thereof, into which the semiconductor device 100 of FIG. 1, a semiconductor device formed according to the process illustrated by FIGS. 2-10, a semiconductor device formed using the method of FIG. 11, or a combination thereof, is integrated. As another illustrative, non-limiting example, one or more of the electronic devices 1362 and 1364 may include remote units, such as mobile phones, hand-held personal communication systems (PCS) units, portable data units such as personal data assistants, global positioning system (GPS) enabled devices, navigation devices, fixed location data units such as meter reading equipment, or any other device that stores or retrieves data or computer instructions, or any combination thereof. Although FIG. 13 illustrates remote units according to teachings of the disclosure, the disclosure is not limited to these illustrated units. Embodiments of the disclosure may be suitably employed in any device which includes active integrated circuitry including memory and on-chip circuitry.

A device that includes the semiconductor device 100 of FIG. 1, a semiconductor device formed according to the process illustrated by FIGS. 2-10, a semiconductor device formed using the method of FIG. 11, or a combination thereof, may be fabricated, processed, and incorporated into an electronic device, as described in the illustrative process 1300. One or more aspects of the embodiments disclosed with respect to FIGS. 1-13 may be included at various processing stages, such as within the library file 1312, the GDSII file 1326 (e.g., a file having a GDSII format), and the GERBER file 1352 (e.g., a file having a GERBER format), as well as stored at the memory 1310 of the research computer 1306, the memory 1318 of the design computer 1314, the memory 1350 of the computer 1346, the memory of one or more other computers or processors (not shown) used at the various stages, such as at the board assembly process 1354, and also incorporated into one or more other physical embodiments such as the mask 1332, the die 1336, the package 1340, the PCA 1358, other products such as prototype circuits or devices (not shown), or any combination thereof. Although various representative stages of production from a physical device design to a final product are depicted, in other embodiments fewer stages may be used or additional stages may be included. Similarly, the process 1300 may be performed by a single entity or by one or more entities performing various stages of the process 1300.

Although one or more of FIGS. 1-13 may illustrate systems, apparatuses, and/or methods according to the teachings of the disclosure, the disclosure is not limited to these illustrated systems, apparatuses, and/or methods. Embodiments of the disclosure may be suitably employed in any device that includes integrated circuitry including memory, a processor, and on-chip circuitry.

Although one or more of FIGS. 1-13 may illustrate systems, apparatuses, and/or methods according to the teachings of the disclosure, the disclosure is not limited to these illustrated systems, apparatuses, and/or methods. One or more functions or components of any of FIGS. 1-13 as illustrated or described herein may be combined with one or more other portions of another of FIGS. 1-13. Accordingly, no single embodiment described herein should be construed as limiting and embodiments of the disclosure may be suitably combined without departing form the teachings of the disclosure.

Those of skill would further appreciate that the various illustrative logical blocks, configurations, modules, circuits, and algorithm steps described in connection with the embodiments disclosed herein may be implemented as electronic hardware, computer software executed by a processor, or combinations of both. Various illustrative components, blocks, configurations, modules, circuits, and steps have been described above generally in terms of their functionality. Whether such functionality is implemented as hardware or processor executable instructions depends upon the particular application and design constraints imposed on the overall system. Skilled artisans may implement the described functionality in varying ways for each particular application, but such implementation decisions should not be interpreted as causing a departure from the scope of the present disclosure.

The steps of a method or algorithm described in connection with the embodiments disclosed herein may be embodied directly in hardware, in a software module executed by a processor, or in a combination of the two. A software module may reside in random access memory (RAM), flash memory, read-only memory (ROM), programmable read-only memory (PROM), erasable programmable read-only memory (EPROM), electrically erasable programmable read-only memory (EEPROM), registers, hard disk, a removable disk, a compact disc read-only memory (CD-ROM), or any other form of non-transient storage medium known in the art. For example, a storage medium may be coupled to the processor such that the processor can read information from, and write information to, the storage medium. In the alternative, the storage medium may be integral to the processor. The processor and the storage medium may reside in an application-specific integrated circuit (ASIC). The ASIC may reside in a computing device or a user terminal. In the alternative, the processor and the storage medium may reside as discrete components in a computing device or user terminal.

The previous description of the disclosed embodiments is provided to enable a person skilled in the art to make or use the disclosed embodiments. Various modifications to these embodiments will be readily apparent to those skilled in the art, and the principles defined herein may be applied to other embodiments without departing from the scope of the disclosure. Thus, the present disclosure is not intended to be limited to the embodiments shown herein but is to be accorded the widest scope possible consistent with the principles and novel features as defined by the following claims.

What is claimed is:

1. An apparatus comprising:
   an interconnect comprising a barrier structure, the barrier structure in contact with a dielectric material;
   a first protective structure in contact with the barrier structure, the dielectric material, and an etch stop layer, wherein an airgap is defined at least in part by the first protective structure and the etch stop layer; and
   a second protective structure in contact with the barrier structure and in contact with a contact, the contact in contact with the dielectric material.

2. The apparatus of claim 1, wherein the interconnect further comprises a liner structure and a conductive structure, the liner structure in contact with the barrier structure, wherein the etch stop layer is in contact with the dielectric material, and wherein the conductive structure is in contact with the liner structure.

3. The apparatus of claim 2, wherein the conductive structure comprises copper (Cu), and wherein the liner structure comprises tantalum (Ta).

4. The apparatus of claim 1, further comprising the contact, wherein the contact is disposed within the dielectric material and in contact with the barrier structure.

5. The apparatus of claim 1, wherein a thickness of the etch stop layer is less than 10 nanometers.

6. The apparatus of claim 1, further comprising a dielectric layer including the dielectric material, wherein the first protective structure comprises silicon nitride (SiN), silicon carbon nitride (SiCN), silicon carbide (SiC), or a combination thereof, and wherein the second protective structure is in contact with the dielectric material.

7. The apparatus of claim 1, wherein the barrier structure comprises tantalum (Ta), titanium nitride (TiN), or a combination thereof.

8. The apparatus of claim 1, further comprising:
a second interconnect, wherein the second interconnect includes a conductive structure and a second barrier structure; and
a third protective structure in contact with the second barrier structure and the etch stop layer.

9. The apparatus of claim 8, further comprising a second etch stop layer, wherein the airgap is further defined by the third protective structure and the second etch stop layer.

10. The apparatus of claim 9, further comprising:
a fourth protective structure in contact with the second barrier structure and the dielectric material.

11. The apparatus of claim 1, wherein the interconnect, the first protective structure, and the second protective structure are integrated into a semiconductor die.

12. The apparatus of claim 1, wherein the interconnect, the first protective structure, and the second protective structure are integrated into a set top box, an entertainment unit, a fixed location data unit, a desktop computer, a display device, a tuner, a media player, or a combination thereof.

13. The apparatus of claim 1, further comprising a processor including the interconnect and the first protective structure.

14. The apparatus of claim 1, wherein the barrier structure is in contact with the contact.

15. The apparatus of claim 1, further comprising the contact, wherein a first material included in the first protective structure is the same as a second material included in the second protective structure.

16. The apparatus of claim 1, wherein the first protective structure and the second protective structure are in contact with a dielectric layer that includes the dielectric material, and wherein the etch stop layer is between the airgap and dielectric layer.

17. The apparatus of claim 1, wherein the first protective structure is between a portion of the barrier structure and the dielectric material.

18. The apparatus of claim 1, wherein the first protective structure extends at least partially through the etch stop layer.

19. The apparatus of claim 1, wherein a portion of the barrier structure that is in contact with the dielectric material is between the first protective structure and the second protective structure.

20. The apparatus of claim 1, wherein a first wall of the barrier structure is in contact with a first wall of the first protective structure, wherein a second wall of the barrier structure is in contact with a first wall of the second protective structure, and wherein a third wall of the barrier structure is in contact with the dielectric material and in contact with a second wall of the second protective structure.

21. An apparatus comprising:
means for resisting diffusion of a conductive material of an interconnect into a dielectric layer of a semiconductor device, the means for resisting diffusion in contact with the dielectric layer, a first protective structure, and a second protective structure, the second protective structure in contact with a contact, and each of the first protective structure, the contact, and the second protective structure in contact with the dielectric layer; and
means for defining an airgap, the means for defining including the first protective structure, wherein the means for defining at least partially defines the airgap and is in contact with the means for resisting diffusion.

22. The apparatus of claim 21, wherein the means for defining further includes one or more etch stop layers and a third protective structure associated with another interconnect, and wherein the means for resisting diffusion includes a barrier structure.

23. The apparatus of claim 21, wherein the means for resisting diffusion and the means for defining are integrated into a mobile phone, a cellular phone, a portable computer, a radio, a satellite radio, a communication device, a portable music player, a portable digital video player, a navigation device, a personal digital assistant (PDA), a mobile location data unit, or a combination thereof.

24. The apparatus of claim 21, wherein the means for resisting diffusion and the means for defining are integrated into a set top box, an entertainment unit, a fixed location data unit, a desktop computer, a display device, a tuner, a media player, or a combination thereof.

25. The apparatus of claim 21, wherein the first protective structure includes a first material that is the same as a second material included in the second protective structure.

26. An apparatus comprising:
an etch stop layer;
an interconnect comprising a barrier structure;
a first protective structure in contact with the barrier structure and the etch stop layer, wherein an airgap is defined at least in part by the first protective structure and the etch stop layer;
a second protective structure in contact with the barrier structure, the second protective structure in contact with a contact; and
a dielectric layer in contact with each of the barrier structure, the first protective structure, the contact, and the second protective structure.

27. The apparatus of claim 26, wherein the etch stop layer is in contact with the dielectric layer and is between the airgap and dielectric layer.

28. The apparatus of claim 26, wherein a portion of the barrier structure that is in contact with the dielectric layer is between the first protective structure and the second protective structure.

29. An apparatus comprising:
a dielectric layer;
a first interconnect comprising a first conductive structure and a first barrier structure, the first barrier structure in contact with the dielectric layer;
a first protective structure in contact with the dielectric layer, the first barrier structure, and an etch stop layer, wherein an airgap is defined at least in part by the first protective structure and the etch stop layer;

a second protective structure in contact with the first barrier structure and in contact with a first contact, the first contact in contact with the dielectric layer and the first barrier structure;

a second interconnect comprising a second conductive structure and a second barrier structure, the second barrier structure in contact with the dielectric layer and in contact with a second contact, the second contact in contact with the dielectric layer; and a third protective structure in contact with the dielectric layer, the second barrier structure, and the etch stop layer, wherein an airgap is defined at least in part by the first protective structure, the third protective structure, and the etch stop layer, the etch stop layer between the airgap and the dielectric layer.

30. The apparatus of claim 29, wherein the first barrier structure comprises tantalum (Ta), titanium nitride (TiN), or a combination thereof.

\* \* \* \* \*